(12) United States Patent
Lee

(10) Patent No.: US 11,967,605 B2
(45) Date of Patent: Apr. 23, 2024

(54) LIGHT EMITTING DEVICE

(71) Applicant: SEOUL VIOSYS CO., LTD., Ansan-si (KR)

(72) Inventor: Chung Hoon Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 16/676,711

(22) Filed: Nov. 7, 2019

(65) Prior Publication Data

US 2020/0152691 A1     May 14, 2020

Related U.S. Application Data

(60) Provisional application No. 62/760,381, filed on Nov. 13, 2018.

(51) Int. Cl.
| | |
|---|---|
| H01L 33/38 | (2010.01) |
| H01L 27/15 | (2006.01) |
| H01L 33/08 | (2010.01) |
| H01L 33/44 | (2010.01) |
| H01L 33/50 | (2010.01) |
| H01L 33/62 | (2010.01) |

(52) U.S. Cl.
CPC ............ *H01L 27/15* (2013.01); *H01L 33/382* (2013.01); *H01L 33/44* (2013.01); *H01L 33/505* (2013.01); *H01L 33/62* (2013.01); *H01L 2933/0016* (2013.01); *H01L 2933/0025* (2013.01); *H01L 2933/0066* (2013.01)

(58) Field of Classification Search
CPC ......... H01L 27/15; H01L 33/44; H01L 33/62; H01L 33/08; H01L 33/382
See application file for complete search history.

(56) References Cited

U.S. PATENT DOCUMENTS

| | | |
|---|---|---|
| 5,696,389 A | 12/1997 | Ishikawa et al. |
| 5,793,405 A | 8/1998 | Shakuda |

(Continued)

FOREIGN PATENT DOCUMENTS

| | | |
|---|---|---|
| EP | 2980871 | 2/2016 |
| JP | 57-005356 | 1/1982 |

(Continued)

OTHER PUBLICATIONS

International Search Report dated Feb. 20, 2020 issued to PCT/KR2019/015342.

(Continued)

*Primary Examiner* — Michele Fan
(74) *Attorney, Agent, or Firm* — Oblon, McClelland, Maier & Neustadt, L.L.P.

(57) ABSTRACT

A light emitting device including a light emitting structure including a plurality of light emitting parts, a dielectric structure disposed outside the light emitting structure, and a plurality of pads disposed on a first surface of the light emitting structure and electrically coupled with the light emitting parts, in which outer sidewalls of the pads are disposed inside an outer sidewall of the light emitting structure and an outer sidewall of the dielectric structure, at least one of the pads extends to a first surface of the dielectric structure, and the first surface of the dielectric structure is coplanar with the first surface of the light emitting structure.

14 Claims, 32 Drawing Sheets

(56) References Cited

U.S. PATENT DOCUMENTS

| | | | |
|---|---|---|---|
| 7,642,560 B2 | 1/2010 | Ogihara | |
| 7,663,140 B2 | 2/2010 | Yamazaki et al. | |
| 8,035,115 B2 | 10/2011 | Ogihara et al. | |
| 8,211,724 B2 | 7/2012 | Kim et al. | |
| 9,368,687 B2 | 6/2016 | Uemura | |
| 10,170,666 B2 | 1/2019 | Cha et al. | |
| 10,840,417 B2 | 11/2020 | Knoerr | |
| 2006/0027820 A1 | 2/2006 | Cao | |
| 2006/0163604 A1 | 7/2006 | Shin et al. | |
| 2008/0251799 A1 | 10/2008 | Ikezawa | |
| 2009/0278142 A1 | 11/2009 | Watanabe et al. | |
| 2009/0315045 A1* | 12/2009 | Horie | H01L 27/153 257/93 |
| 2010/0258822 A1* | 10/2010 | Kobayashi | H01L 25/0753 257/88 |
| 2016/0013376 A1 | 1/2016 | Maki | |
| 2016/0254428 A1 | 9/2016 | Ting et al. | |
| 2018/0182746 A1* | 6/2018 | Bibl | H01L 33/06 |

FOREIGN PATENT DOCUMENTS

| | | |
|---|---|---|
| JP | 58-050575 | 3/1983 |
| JP | 58-130582 | 8/1983 |
| JP | 05-129658 | 5/1993 |
| JP | 07-254732 | 1/1995 |
| JP | 2004-014993 | 1/2004 |
| JP | 2004014993 A * | 1/2004 |
| JP | 2005-072323 | 3/2005 |
| JP | 2005-129799 | 5/2005 |
| JP | 2005-216917 | 8/2005 |
| JP | 2006-012793 | 1/2006 |
| JP | 2006-106670 | 4/2006 |
| JP | 2006-106671 | 4/2006 |
| JP | 2006-106672 | 4/2006 |
| JP | 2006-319099 | 11/2006 |
| JP | 2007-095844 | 4/2007 |
| JP | 2008-263127 | 10/2008 |
| JP | 2010-157692 | 7/2010 |
| JP | 2011-243615 | 12/2011 |
| JP | 2014-158001 | 8/2014 |
| JP | 2016-015474 | 1/2016 |
| KR | 10-2006-0086695 | 8/2006 |
| KR | 10-2016-0126943 | 11/2016 |
| KR | 20160126943 A * | 11/2016 |
| KR | 10-2017-0115142 | 10/2017 |
| WO | 2017198656 | 11/2017 |
| WO | WO-2019053923 A1 * | 3/2019 ........... H01L 27/156 |

OTHER PUBLICATIONS

Extended European Search Report dated Jul. 8, 2022, issued to European Patent Application No. 19885677.5.

Notification of reasons for refusal dated Jul. 25, 2023 issued to Japanese Patent Application No. 2021-521824 (with English Translation).

* cited by examiner

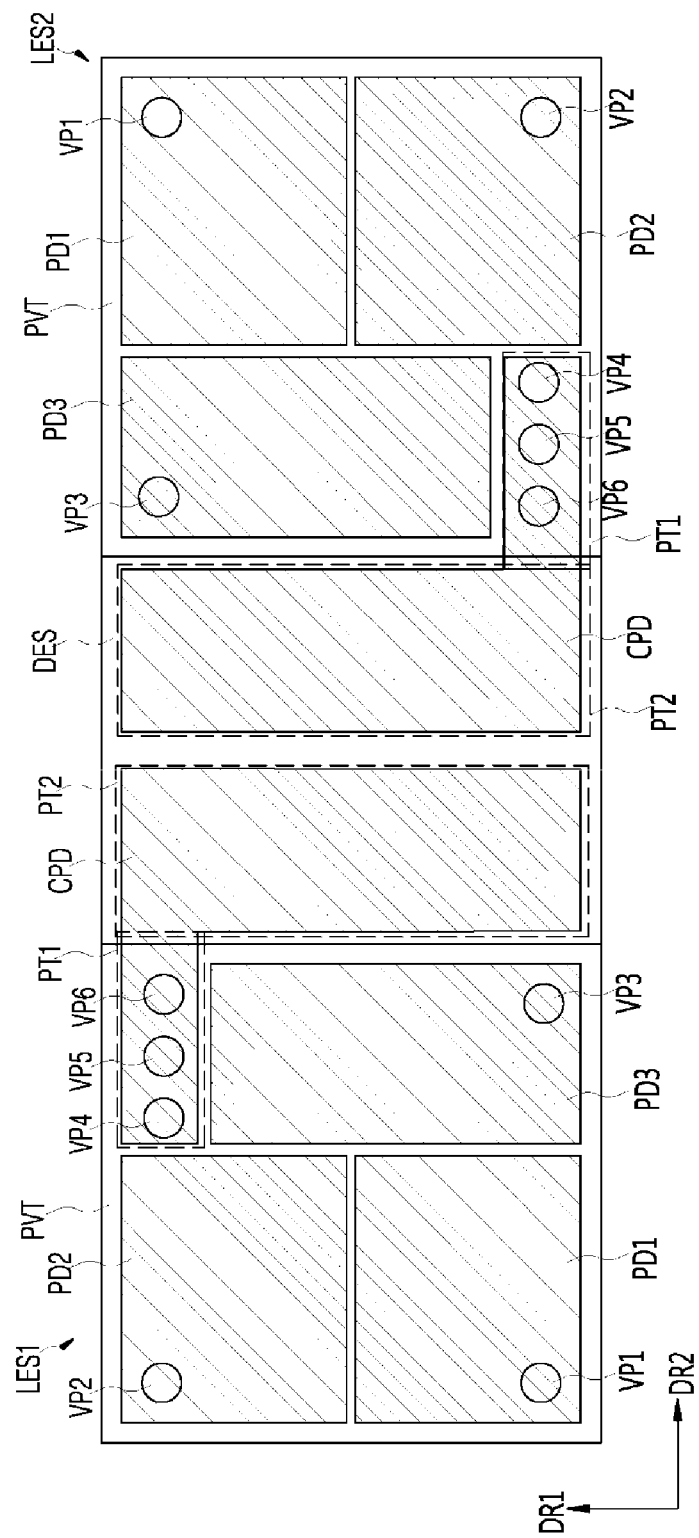

LIGHT EMITTING DEVICE

CROSS-REFERENCE TO RELATED APPLICATION

This application claims the benefit of U.S. Provisional Patent Application No. 62/760,381, filed on Nov. 13, 2018, which is hereby incorporated by reference for all purposes as if set forth herein.

BACKGROUND

Field

Exemplary embodiments of the invention relate generally to a light emitting device, and more specifically, to a light emitting device including a plurality of light emitting parts.

Discussion of the Background

Light emitting diodes, as inorganic light sources, are being diversely used in various fields, such as display devices, vehicle lamps, and general lighting. Light emitting diodes are rapidly replacing existing light sources due to their longer lifetime, lower power consumption, and faster response speed than existing light sources.

In general, a display device displays various colors by utilizing mixed colors of blue, green, and red. Each pixel of a display device includes blue, green, and red sub-pixels, the color of a particular pixel is determined through the colors of these sub-pixels, and an image is displayed by a combination of pixels.

Light emitting diodes have been mainly used as backlight sources in display devices. However, recently, a micro LED display has been developed as a next generation display, which directly displays images by using light emitting diodes.

The above information disclosed in this Background section is only for understanding of the background of the inventive concepts, and, therefore, it may contain information that does not constitute prior art.

SUMMARY

Light emitting devices constructed according to exemplary embodiments of the invention are capable of electrically and stably mounting a light emitting device of a micro unit to a mounting substrate.

Additional features of the inventive concepts will be set forth in the description which follows, and in part will be apparent from the description, or may be learned by practice of the inventive concepts.

A light emitting device according to an exemplary embodiment includes a light emitting structure including a plurality of light emitting parts, a dielectric structure disposed outside the light emitting structure, and a plurality of pads disposed on a first surface of the light emitting structure and electrically coupled with the light emitting parts, in which outer sidewalls of the pads are disposed inside an outer sidewall of the light emitting structure and an outer sidewall of the dielectric structure, at least one of the pads extends to a first surface of the dielectric structure, and the first surface of the dielectric structure is coplanar with the first surface of the light emitting structure.

Remaining pads except the at least one pad that extends to the dielectric structure may be disposed within the light emitting structure.

The at least one pad that extend to the dielectric structure may include a first portion disposed on the first surface of the light emitting structure and having a first width, and a second portion extending from the first portion to the first surface of the dielectric structure and having a second width greater than the first width.

Remaining pads except the at least one pad that extends to the dielectric structure may have a third width greater than the first width.

The at least one pad that extends to the dielectric structure may include a first portion disposed on the first surface of the light emitting structure and having a first area, and a second portion extending from the first portion to the first surface of the dielectric structure and having a second area greater than the first area.

The at least one pad that extends to the dielectric structure may include a first portion covering at least a portion of the first surface of the light emitting structure and having a first width, and a second portion extending from the first portion to the first surface of the dielectric structure and having a second width substantially the same as the first width.

The pads may be horizontally spaced apart from each another.

The light emitting device may further include a passivation layer disposed on the light emitting structure, in which the at least one pad that extends to the first surface of the dielectric structure may overlap with at least one of the remaining pads while being insulated from each other by the passivation layer.

Each of the pads may have substantially the same size.

The light emitting structure may be formed in plural, the dielectric structure may be disposed between the light emitting structures, and the at least one pad that extends to the first surface of the dielectric structure may be electrically coupled with at least one of light emitting parts of a neighboring light emitting structure.

The light emitting device may further include conductive parts disposed on the pads and electrically bonding the pads to a mounting substrate, in which the at least one pad may be disposed between at least one of the conductive parts and the first surface of the dielectric structure.

The light emitting structure may include a first light emitting part, a second light emitting part, and a third light emitting part each including a first-type semiconductor layer, an active layer, and a second-type semiconductor layer.

The pads may include a first pad electrically coupled with the second-type semiconductor layer of the first light emitting part through a first through pattern, a second pad electrically coupled with the second-type semiconductor layer of the second light emitting part through a second through pattern, a third pad electrically coupled with the second-type semiconductor layer of the third light emitting part through a third through pattern, and a common pad electrically coupled with the first-type semiconductor layers of the first, second, and third light emitting parts through a fourth through pattern, a fifth through pattern, and a sixth through pattern.

The common pad may include a first portion contacting the fourth, fifth, and sixth through patterns and having a first width, and a second portion extending from the first portion to the first surface of the dielectric structure and having a second width greater than the first width.

Each of the first and third pads may have a third width greater than the first width.

The common pad may include a first portion covering at least a portion of the first surface of the light emitting structure and having a first width, and a second portion extending from the first portion to the first surface of the dielectric structure and having a second width greater to the first width.

The common pad may entirely cover the first surface of the light emitting structure and include holes exposing the first, second, and third through patterns, respectively, and the first, second, and third through patterns may be electrically coupled with the first, second, and third pads through the holes, respectively.

The light emitting device may further include a passivation layer insulating the common pad and the first, second, and third pads from one another.

The light emitting structure may be formed in plural, the dielectric structure may be disposed between the light emitting structures, and the common pads of neighboring light emitting structures may be integrated with each other.

The first-type semiconductor layers of neighboring light emitting structures may be integrated with each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 2B and 3B are top views of the light emitting devices shown in FIGS. 2A and 3B, respectively.

DETAILED DESCRIPTION

Figure 1A:
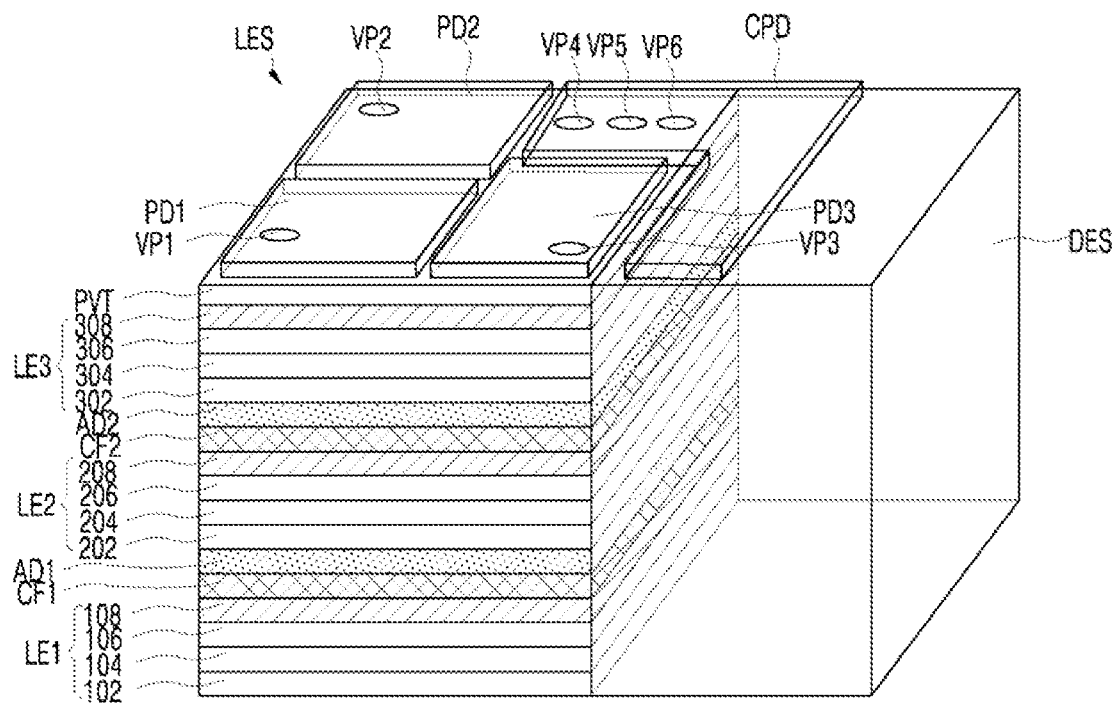
FIG. 1A is a perspective view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
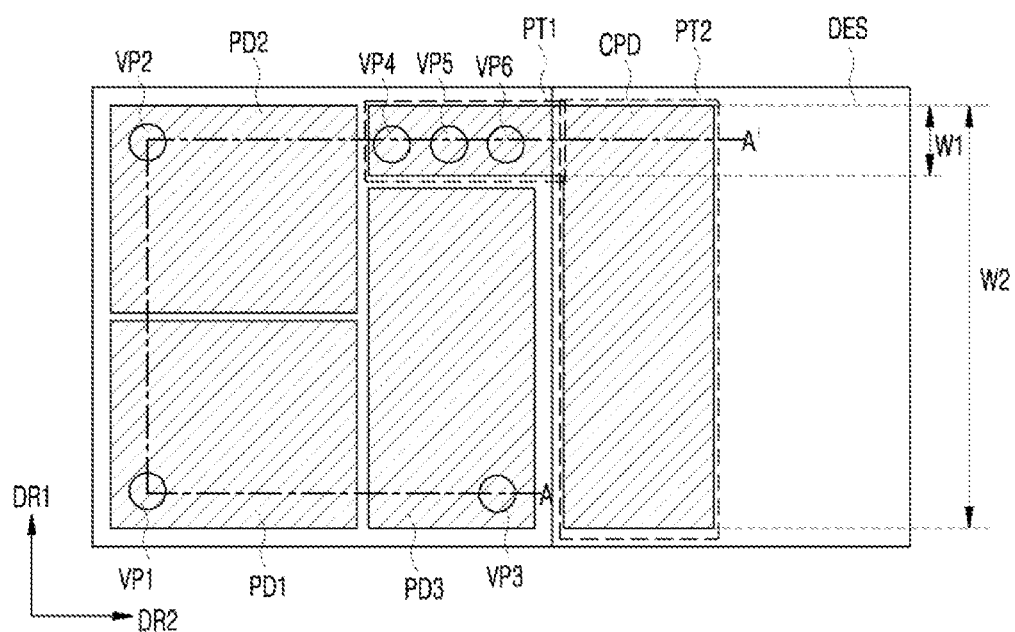
FIG. 1B is a top view of the light emitting device of FIG. 1A.
Figure 1C:
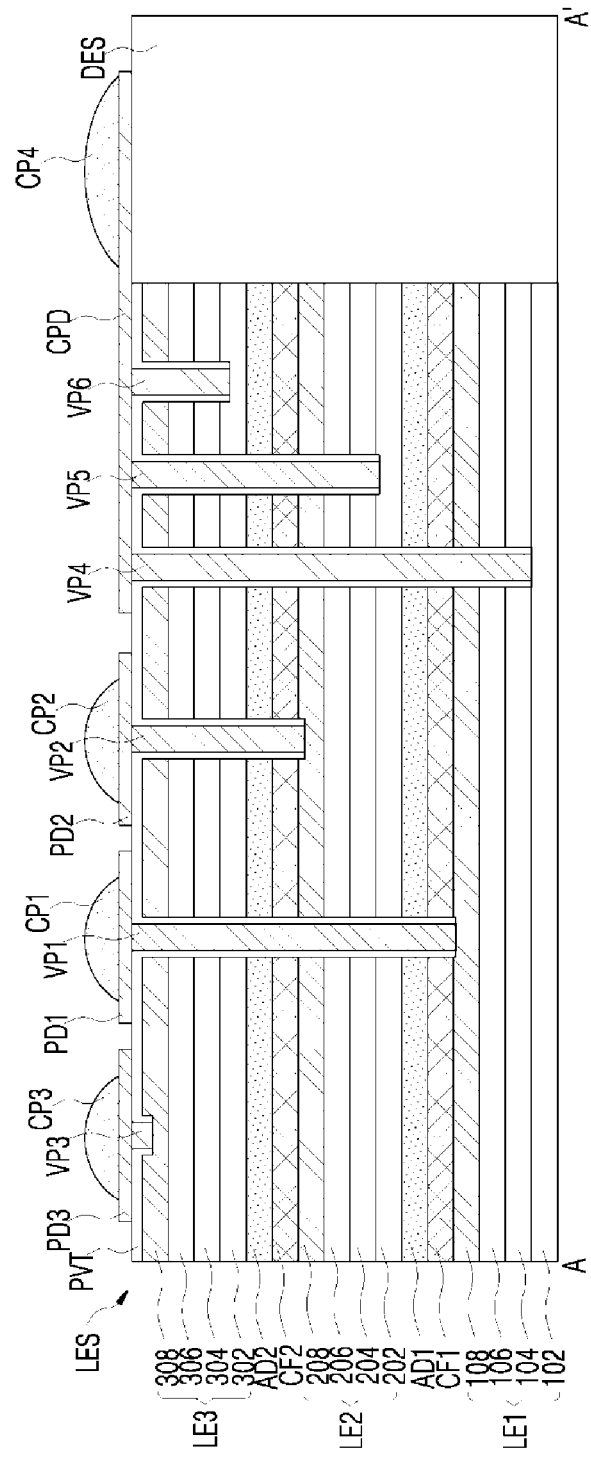
FIG. 1C is a cross-sectional view taken along line A-A' of FIG. 1B.
Figure 1D:
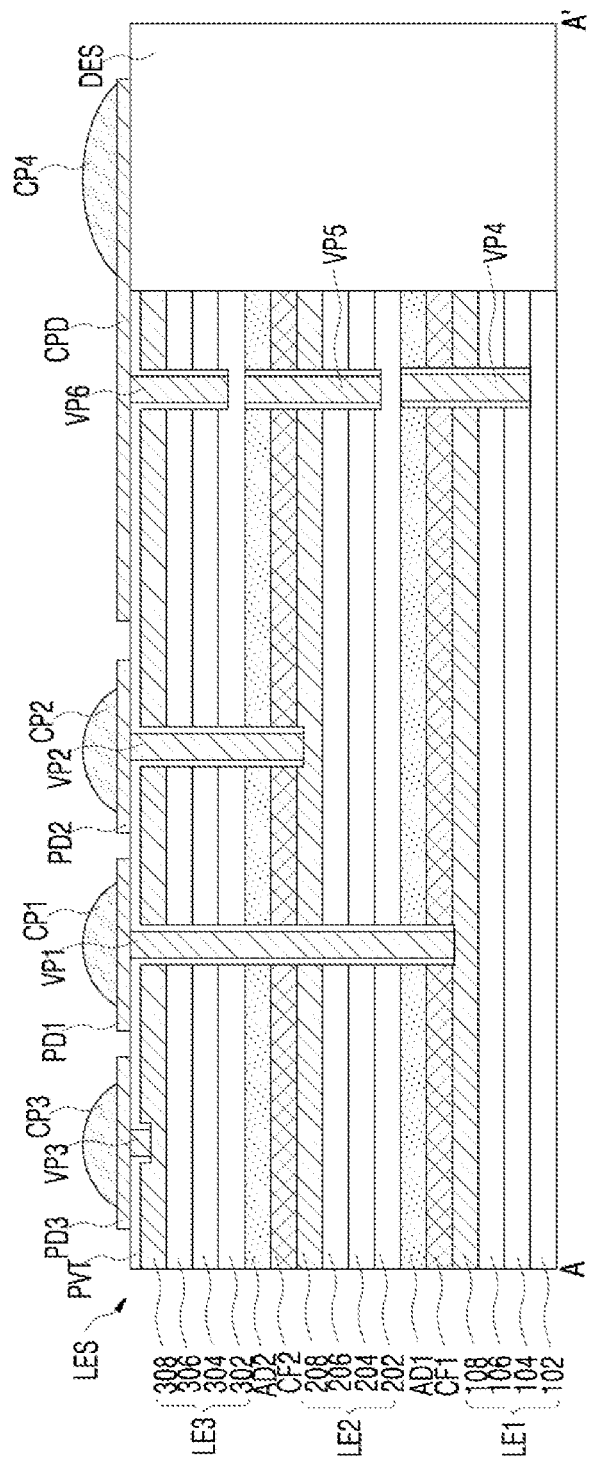
FIG. 1D is a cross-sectional view of the light emitting device of FIG. 1B according to another exemplary embodiment.
Figure 2A:
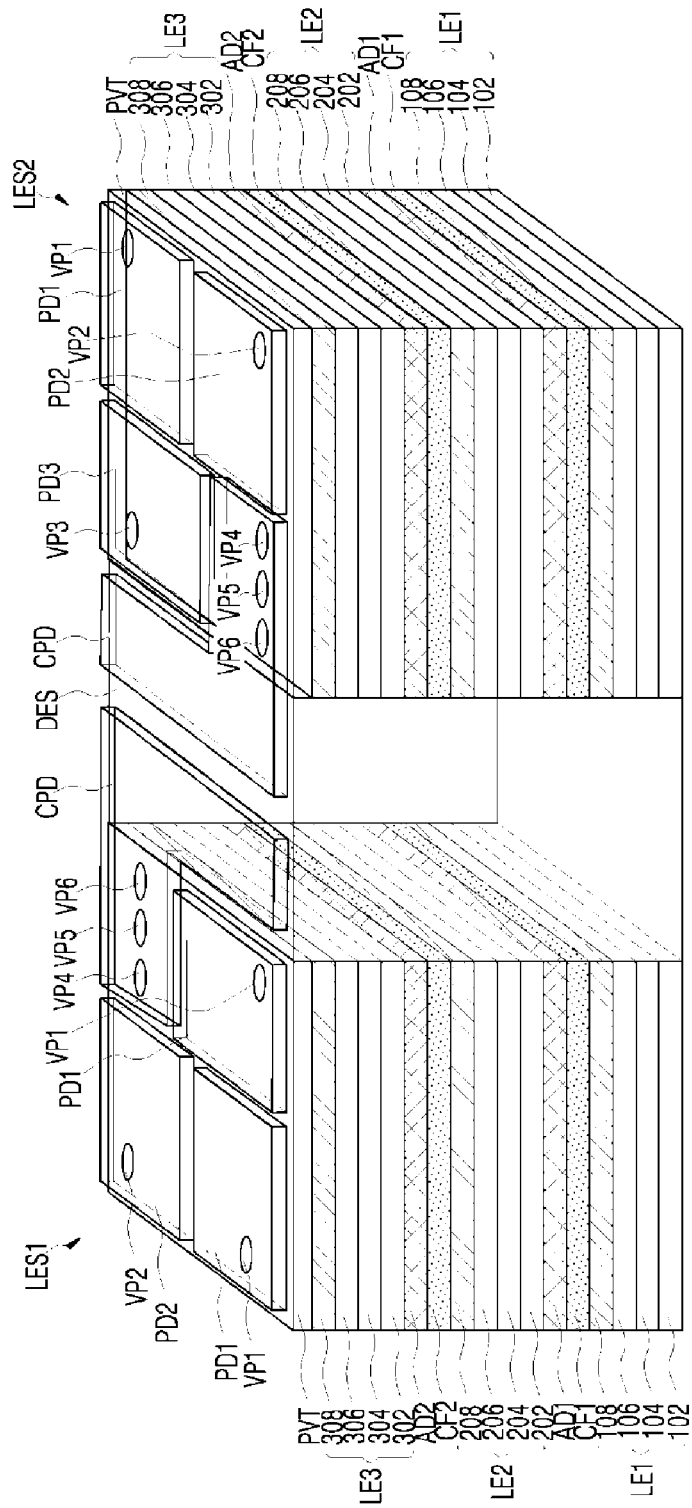
FIGS. 2A and 3A are perspective views of light emitting devices according to exemplary embodiments.
Figure 3A:
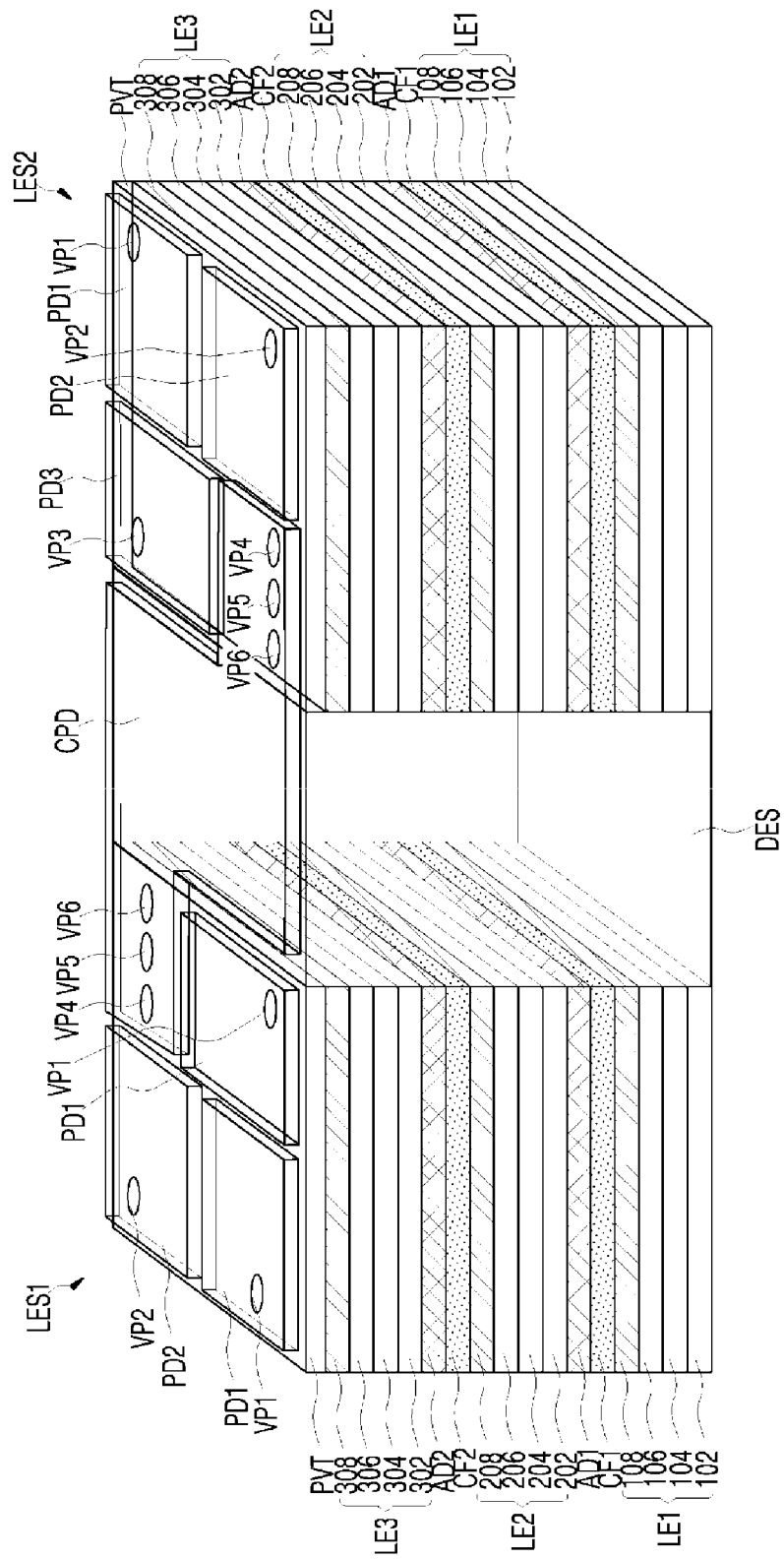
Figure 3B:
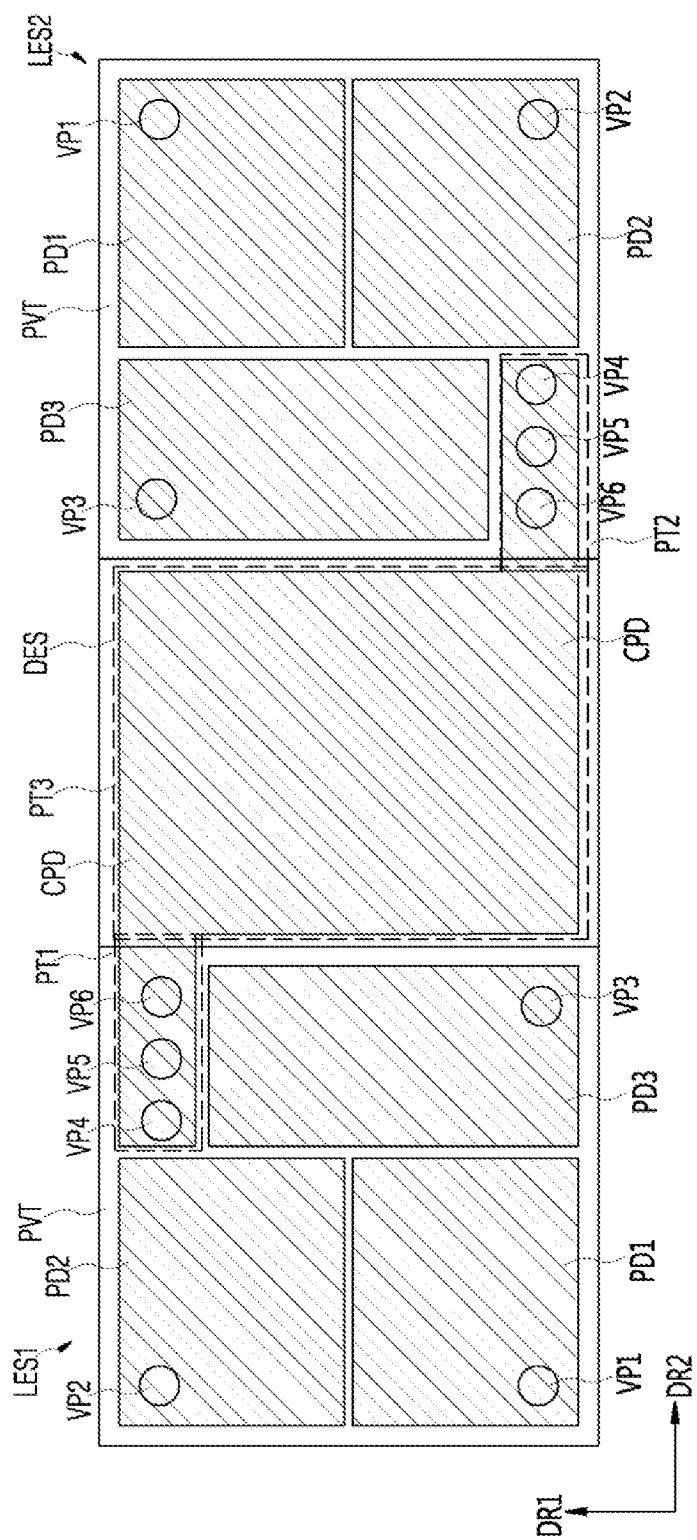

FIG. 1A is a perspective view of a light emitting device according to an exemplary embodiment, FIG. 1B is a top view of the light emitting device shown in FIG. 1A, and FIG. 1C is a cross-sectional view taken along line A-A' of FIG. 1B. FIG. 1D is a cross-sectional view of the light emitting device shown in FIG. 1B according to another exemplary embodiment. FIGS. 2A and 3A are perspective views of light emitting devices according to exemplary embodiments, and FIGS. 2B and 3B are top views of the light emitting devices shown in FIGS. 2A and 3A, respectively.

Referring to FIGS. 1A to 3B, a light emitting device may include a light emitting structure LES, which includes a plurality of light emitting parts and a dielectric structure DES disposed outside the light emitting structure LES.

The light emitting structure LES may include a first light emitting part LE1, a second light emitting part LE2, and a third light emitting part LE3, which are vertically stacked.

According to an exemplary embodiment, a surface of the first light emitting part LE1 facing away the second light emitting part LE2 may be a light extraction surface. In this case, the wavelength of light emitted from the first light emitting part LE1 may be the shortest, the wavelength of light emitted from the second light emitting part LE2 may be longer than the wavelength of light emitted from the first light emitting part LE1 and be shorter than the wavelength of light emitted from the third light emitting part LE3, and the wavelength of light emitted from the third light emitting part LE3 may be the longest. For example, the first light emitting part LE1 may emit blue light, the second light emitting part LE2 may emit green light, and the third light emitting part LE3 may emit red light. However, the inventive concepts are not limited thereto, and in some exemplary embodiments, the first light emitting part LE1 may emit green light, and the second light emitting part LE2 may emit blue light.

The first light emitting part LE1 may include a first n-type semiconductor layer 102, a first active layer 104, a first p-type semiconductor layer 106, and a first ohmic layer 108. The second light emitting part LE2 may include a second n-type semiconductor layer 202, a second active layer 204, a second p-type semiconductor layer 206, and a second ohmic layer 208. The third light emitting part LE3 may include a third n-type semiconductor layer 302, a third active layer 304, a third p-type semiconductor layer 306, and a third ohmic layer 308.

Each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. As each of the first ohmic layer 108, the second ohmic layer 208, and the third ohmic layer 308, a transparent conductive oxide (TCO), such as zinc oxide (ZnO), indium tin oxide (ITO), zinc-doped indium tin oxide (ZITO), zinc indium oxide (ZIO), gallium indium oxide (GIO), zinc tin oxide (ZTO), fluorine-doped tin oxide (FTO), gallium-doped zinc oxide (GZO), aluminum-doped zinc oxide (AZO), and the like may be used.

The first light emitting part LE1 may be spaced apart from the second light emitting part LE2. For example, the first ohmic layer 108 of the first light emitting part LE1 and the second n-type semiconductor layer 202 of the second light emitting part LE2 may face each other. As another example, the first ohmic layer 108 of the first light emitting part LE1 and the second ohmic layer 208 of the second light emitting part LE2 may face each other.

The second light emitting part LE2 may be spaced apart from the third light emitting part LE3. For example, the second ohmic layer 208 of the second light emitting part LE2 and the third ohmic layer 308 of the third light emitting part LE3 may face each other. As another example, the second ohmic layer 208 of the second light emitting part LE2 and the third n-type semiconductor layer 302 of the third light emitting part LE3 may face each other.

The light emitting device may further include a first bonding part AD1 disposed between the first light emitting part LE1 and the second light emitting part LE2 to bond the first light emitting part LE1 and the second light emitting part LE2, and a second bonding part AD2 disposed between the second light emitting part LE2 and the third light emitting part LE3 to bond the second light emitting part LE2 and the third light emitting part LE3. Each of the first bonding part AD1 and the second bonding part AD2 may include a material that transmits visible light and has an insulation property. Each of the first bonding part AD1 and the second bonding part AD2 may include polymer, resist, polyimide, etc. For example, each of the first bonding part AD1 and the second bonding part AD2 may include at least one of epoxy, PAE (poly arylene ether) based Flare™, MSSQ (methylsilsesquioxane), PMMA (polymethylmethacrylate), PDMS (polydimethylsiloxane), fluoropolymer, polyimide, MSSQ (methylsilisequioxane), PEEK (polyethereherketone), ATSP (Aromatic Thermosetting Polyester), PVDC (Polyvinylidene chloride), LCP (liquid-crystal polymer), SOG (spin-on-glass), BCB (benzo cyclo butadiene), HSQ (hydrogen silsesquioxanes), SU-8 photoresist, or wax.

In an exemplary embodiment, the light emitting device may further include a first color filter CF1 disposed between the first light emitting part LE1 and the second light emitting part LE2, and a second color filter CF2 disposed between the second light emitting part LE2 and the third light emitting part LE3. The first color filter CF1 may be disposed on the first ohmic layer 108 of the first light emitting part LE1 or the n-type semiconductor layer 202 of the second light emitting part LE2. The second color filter CF2 may be disposed on the second ohmic layer 208 of the second light emitting part LE2 or the third n-type semiconductor layer 302 of the third light emitting part LE3. The first color filter CF1 may reflect light emitted from the first light emitting part LE1 and pass light emitted from the second light emitting part LE2 and the third light emitting part LE3, so that light emitted from the first light emitting part LE1 does not exert an influence on each of the second light emitting part LE2 and the third light emitting part LE3. The second color filter CF2 may reflect light emitted from the first light emitting part LE1 and the second light emitting part LE2 and pass light emitted from the third light emitting part LE3, so that light emitted from the first light emitting part LE1 and the second light emitting part LE2 does not exert an influence on the third light emitting part LE3. Each of the first color filter CF1 and the second color filter CF2 may include a distributed Bragg reflector (DBR), in which $TiO_2$ and $SiO_2$ are alternately stacked. The first color filter CF1 may be different from the second color filter CF2 in terms of the alternation number of $TiO_2$ and $SiO_2$ and thickness. In some exemplary embodiments, at least one of the first color filter CF1 and the second color filter CF2 may be selectively omitted.

The light emitting structure LES may further include a first through pattern VP1, which passes through the third light emitting part LE3, the second bonding part AD2, the second color filter CF2, the second light emitting part LE2, the first bonding part AD1 and the first color filter CF1 and is electrically coupled with the first ohmic layer 108, a second through pattern VP2, which passes through the third light emitting part LE3, the second bonding part AD2, and the second color filter CF2 and is electrically coupled with the second ohmic layer 208, and a third through pattern VP3, which is electrically coupled with the third ohmic layer 308. In some exemplary embodiments, the third through pattern VP3 may be omitted.

Also, the light emitting structure LES may further include a fourth through pattern VP4, which passes through the third light emitting part LE3, the second bonding part AD2, the second color filter CF2, the second light emitting part LE2, the first bonding part AD1, the first color filter CF1, the first ohmic layer 108, the first p-type semiconductor layer 106, and the first active layer 104 and is electrically coupled with the first n-type semiconductor layer 102, a fifth through pattern VP5, which passes through the third light emitting part LE3, the second bonding part AD2, the second color filter CF2, the second ohmic layer 208, the second p-type semiconductor layer 206, and the second active layer 204 and is electrically coupled with the second n-type semiconductor layer 202, and a sixth through pattern VP6, which passes through the third ohmic layer 308, the third p-type semiconductor layer 306, and the third active layer 304 and is electrically coupled with the third n-type semiconductor layer 302. The light emitting structure LES may further include a passivation layer PVT, which surrounds the first through pattern VP1, the second through pattern VP2, the third through pattern VP3, the fourth through pattern VP4, the fifth through pattern VP5, and the sixth through pattern VP6, and extends to the top surface of the third light emitting part LE3. The passivation layer PVT may expose the respective top surfaces of the first through pattern VP1, the second through pattern VP2, the third through pattern VP3, the fourth through pattern VP4, the fifth through pattern VP5, and the sixth through pattern VP6.

According to an exemplary embodiment, the passivation layer PVT may include a material, which has an etching selectivity with respect to the dielectric structure DES and an etchant. For example, the passivation layer PVT may include at least one of $SiN_x$, $TiN_x$, $TiO_x$, $TaO_x$, $ZrO_x$, $HfO_x$, $Al_xO_y$, and $SiO_x$.

Referring to FIG. 1D, in the light emitting structure LES according to another embodiment, a fourth through pattern VP4 may pass through the first bonding part AD1, the first color filter CF1, the first ohmic layer 108, the first p-type semiconductor layer 106, and the first active layer 104 and electrically couple the first n-type semiconductor layer 102 and the second n-type semiconductor layer 202. A fifth through pattern VP5 may pass through the second bonding part AD2, the second color filter CF2, the second ohmic layer 208, the second p-type semiconductor layer 206, and the second active layer 204 and electrically couple the second n-type semiconductor layer 202 and the third n-type semiconductor layer 302. A sixth through pattern VP6 may pass through the third ohmic layer 308, the third p-type semiconductor layer 306, and the third active layer 304 and electrically couple the third light emitting part LE3 and a common pad CPD. Alternatively, in some exemplary embodiments, the first, second, and third through patterns VP1, VP2, and VP3 may be electrically connected to the first, second, and third n-type semiconductor layers 102, 202, and 302, respectively, and the fourth, fifth, and sixth through patterns VP4, VP5, and VP6 may electrically couple the first, second, and third ohmic layers 108, 208, and 308 and the common pad CPD. Hereinafter, the light emitting device will be illustrated with reference to FIG. 1C, however, the inventive concepts are not limited thereto.

The light emitting structure LES may further include a first pad PD1, a second pad PD2, a third pad PD3, and the common pad CPD, which are disposed on the passivation layer PVT and are separated from one another. The first pad PD1 may be electrically bonded with the first through pattern VP1 and be electrically coupled with the first ohmic layer 108. The second pad PD2 may be electrically bonded with the second through pattern VP2 and be electrically coupled with the second ohmic layer 208. The third pad PD3 may be electrically bonded with the third through pattern VP3 and be electrically coupled with the third ohmic layer 308. The common pad CPD may be electrically bonded in common with the fourth through pattern VP4, the fifth through pattern VP5, and the sixth through pattern VP6 and be electrically coupled in common with the first n-type semiconductor layer 102, the second n-type semiconductor layer 202, and the third n-type semiconductor layer 302.

In general, the first pad PD1, the second pad PD2, the third pad PD3, and the common pad CPD of the light emitting structure LES may be disposed to be separated from one another, by dividing the area of the passivation layer PVT into four equal parts. However, as the size of a light emitting device is reduced to a micro unit, the area of the top surface of the light emitting structure LES, such as the top surface of the passivation layer PVT, is reduced. As such, the area of each of the first pad PD1, the second pad PD2, the third pad PD3, and the common pad CPD may also be reduced, which may increase the electrical resistance of each of the first pad PD1, the second pad PD2, the third pad PD3, and the common pad CPD. Moreover, when mounting the first pad PD1, the second pad PD2, the third pad PD3, and the common pad CPD to a mounting substrate, it may be difficult to secure the area of each of the first pad PD1, the second pad PD2, the third pad PD3, and the common pad CPD. As such, it may be difficult to electrically bond the first pad PD1, the second pad PD2, the third pad PD3, and the common pad CPD stably with pads on the mounting substrate.

According to an exemplary embodiment, at least one of the first pad PD1, the second pad PD2, the third pad PD3, and the common pad CPD may have a structure that extends from the top surface of the light emitting structure LES to a dielectric structure DES. In this manner, as a contact area between at least one pad and the top surface of the light emitting structure LES is reduced by the one pad extending to the top surface of the dielectric structure DES, the one pad may secure a sufficient area on the dielectric structure DES. Further, as the remaining pads are disposed on the top surface of the light emitting structure LES having a predetermined area, each of the remaining pads may secure a wider area as compared to when each of the four pads is confined within the top surface of the light emitting structure LES.

The dielectric structure DES may have a top surface that is coplanar with one surface of the light emitting structure LES. For example, the top surface of the dielectric structure DES may be coplanar with the top surface of the light emitting structure LES. In some exemplary embodiments, additional patterns of various structures may be further disposed on the passivation layer PVT of the light emitting structure LES. In this case, the top surfaces of the added patterns may be the top surface of the light emitting structure LES.

The dielectric structure DES may include at least one of $SiN_x$, $TiN_x$, $TiO_x$, $TaO_x$, $ZrO_x$, $HfO_x$, $Al_xO_y$, and $SiO_x$. Alternatively, the dielectric structure DES may include at least one of an EMC (epoxy molding compound), a photoresist, epoxy, PDMS (polydimethylsiloxane), silicone, SOG (Spin-On-Glass), BCB (Benzo Cyclo Butadiene), HSQ (Hydrogen Silses Quioxanes), SU-8 photoresist, PAE (poly arylene ether) based Flare™, MSSQ (methylsilsesquioxane), PMMA (polymethylmethacrylate), fluoropolymer, polyimide, MSSQ (methylsilisequioxane), PEEK (polyethereherketone), ATSP (Aromatic Thermosetting Polyester), PVDC (Polyvinylidene chloride), LCP (liquid-crystal polymer), wax, or a black matrix. As described above, the dielectric structure DES may include a material that has an etching selectivity with respect to the passivation layer PVT and an etchant.

Hereinafter, at least one pad that extends to the top surface of the dielectric structure DES will be described with reference to the common pad CPD, however, the inventive concepts are not limited thereto.

The common pad CPD may include a first portion PT1, which is electrically coupled with the fourth through pattern VP4, the fifth through pattern VP5, and the sixth through pattern VP6 on the top surface of the light emitting structure LES, and a second portion PT2, which extends from the first portion PT1 to the top surface of the dielectric structure DES. The first portion PT1 of the common pad CPD may have a first area, and the second portion PT2 of the common pad CPD may have a second area larger than the first area. For example, the first portion PT1 may have a first width W1, and the second portion PT2 may have a second width W2 greater than the first width W1. As used herein, a width direction is defined as a first direction DR1, and a direction perpendicular to the first direction DR1 is defined as a second direction DR2.

According to an exemplary embodiment, the first area may be a minimum area to be electrically coupled with the fourth through pattern VP4, the fifth through pattern VP5, and the sixth through pattern VP6. The second area may be a maximum area based on the size of the dielectric structure DES and the relationship between the dielectric structure DES and the neighboring light emitting structure LES. In this manner, the common pad CPD may be formed on a sufficient area on the dielectric structure DES to be electrically stable.

The common pad CPD may be disposed on the top surface of the light emitting structure LES with the minimum first area, and the first pad PD1, the second pad PD2, and the third pad PD3 may be disposed on the remaining top surface of the light emitting structure LES, except an area in which the first portion PT1 of the common pad CPD is disposed. For example, each of the first pad PD1, the second pad PD2, and the third pad PD3 may have an area larger than the first area. For example, each of the first pad PD1, the second pad PD2, and the third pad PD3 may have a width greater than the first width W1. In some exemplary embodiments, the areas of first pad PD1, the second pad PD2, and the third pad PD3 may be the same or different from each other.

According to an exemplary embodiment, the outer sidewall of each of the first pad PD1, the second pad PD2, the third pad PD3, and the common pad CPD may be disposed within the outer sidewall of the light emitting structure LES and the outer sidewall of the dielectric structure DES. For example, each of the first pad PD1, the second pad PD2, and the third pad PD3 may be disposed within the light emitting structure LES. The first portion PT1 of the common pad CPD may be disposed within the light emitting structure LES, and the second portion PT2 of the common pad CPD may be disposed within the dielectric structure DES.

As shown in FIGS. 1A and 1B, the common pad CPD may have an inverted shape, such as an "L" shape, when viewed from the top. Each of the first pad PD1, the second pad PD2, and the third pad PD3 may have substantially a quadrangular structure.

While the at least one pad that extends to the top surface of the dielectric structure DES is described as the common pad CPD in the illustrated exemplary embodiment, however, the inventive concepts are not limited thereto, and the at least one pad that extends to the top surface of the dielectric structure DES may be any one or more of the first pad PD1, the second pad PD2, the third pad PD3, and the common pad CPD.

According to an exemplary embodiment, as shown in FIG. 1C, a first conductive part CP1, a second conductive part CP2, a third conductive part CP3, and a fourth conductive part CP4 may be disposed on the first pad PD1, the second pad PD2, the third pad PD3, and the common pad CPD, respectively. Each of the first conductive part CP1, the second conductive part CP2, the third conductive part CP3, and the fourth conductive part CP4 may be a solder ball including metal, such as In, Sn, Ni, and Cu. The shape of the conductive part is not particularly limited, and in some exemplary embodiments, a thin film layer including metals, such as In, Sn, Ni, and Cu may be further formed on the first to third pads PD1, PD2, and PD3, and the common pad CPD. At least one among the first conductive part CP1, the second conductive part CP2, the third conductive part CP3, and the fourth conductive part CP4 may be disposed on the dielectric structure DES. For example, the fourth conductive part CP4 may be disposed on the dielectric structure DES. In some exemplary embodiments, a portion of the fourth conductive part CP4 may extend onto the light emitting structure LES.

For example, as shown in FIG. 1C, each of the first conductive part CP1, the second conductive part CP2, the third conductive part CP3, and the fourth conductive part CP4 may have a curved top surface. As another example, each of the first conductive part CP1, the second conductive part CP2, the third conductive part CP3, and the fourth conductive part CP4 may have a flat top surface. The first conductive part CP1, the second conductive part CP2, the third conductive part CP3, and the fourth conductive part CP4 may be disposed on the pads of a mounting substrate.

Hereinafter, repeated descriptions as to the first conductive part CP1, the second conductive part CP2, the third conductive part CP3, and the fourth conductive part CP4 will be omitted.

Referring to FIGS. 2A, 2B, 3A, and 3B, a light emitting device may include a plurality of light emitting structures LES. By forming the dielectric structure DES between the plurality of light emitting structures LES, the light emitting structures LES may be electrically isolated from each other. The light emitting structures LES may include a first light emitting structure LES1 and a second light emitting structure LES2. Each of a first common pad CPD of the first light emitting structure LES1 and a second common pad CPD of the second light emitting structure LES2 may extend to the top surface of a dielectric structure DES disposed between the first light emitting structure LES1 and the second light emitting structure LES2.

Referring to FIGS. 2A and 2B, the first common pad CPD and the second common pad CPD according to an exemplary embodiment may be disposed to be separated from each other. Referring to FIGS. 3A and 3B, the first common pad CPD and the second common pad CPD according to another exemplary embodiment may be integrated with each other into as a single component.

Referring to FIGS. 2A and 2B, the first common pad CPD has a side (e.g., a long side), which extends in a second direction DR2 and is substantially parallel to the first side of the dielectric structure DES as a long side, and the second common pad CPD has a side (e.g., a long side), which is substantially parallel to the second side of the dielectric structure DES opposing the first side thereof. For example, when viewed from the top, the first common pad CPD may have an inverted L-shaped structure, and the second common pad CPD may have an L-shaped structure. Referring to FIG. 2B, the second light emitting structure LES2 may have a structure, which is obtained by rotating the first light emitting structure LES1 in 180 degrees in a clockwise direction.

Referring to FIGS. 3A and 3B, the first common pad CPD and the second common pad CPD may be integrated with each other as a single element. The common pad CPD of the integral type may include first portions PT1 that extend to the first light emitting structure LES1 and the second light emitting structure LES2, respectively, a second portion PT2 that couples the first portions PT1 and is disposed on the dielectric structure DES. The first portions PT1 may have substantially the same first area, and the second portion PT2 may have a second area larger than the first area.

Figure 4A:
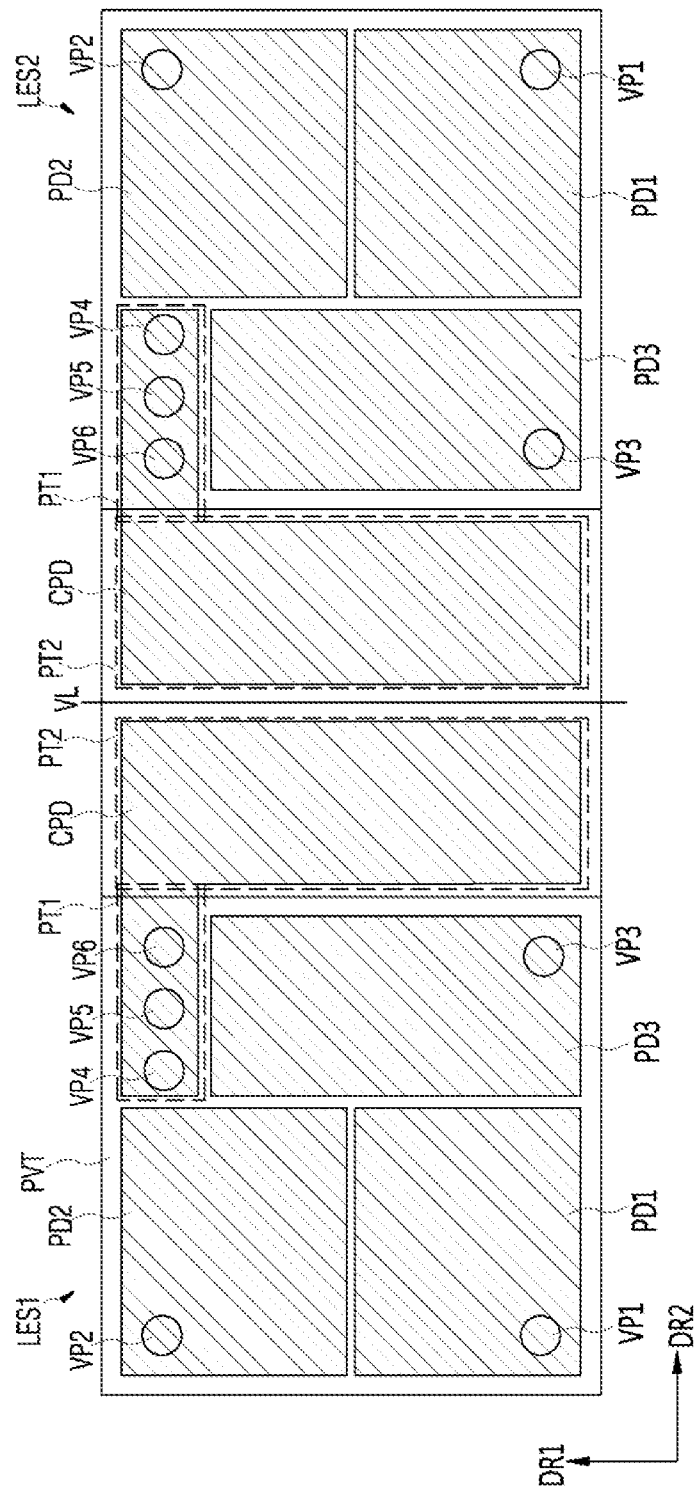
FIGS. 4A and 4B are top views of the light emitting devices shown in FIGS. 2B and 3B according to exemplary embodiments.
Figure 4B:
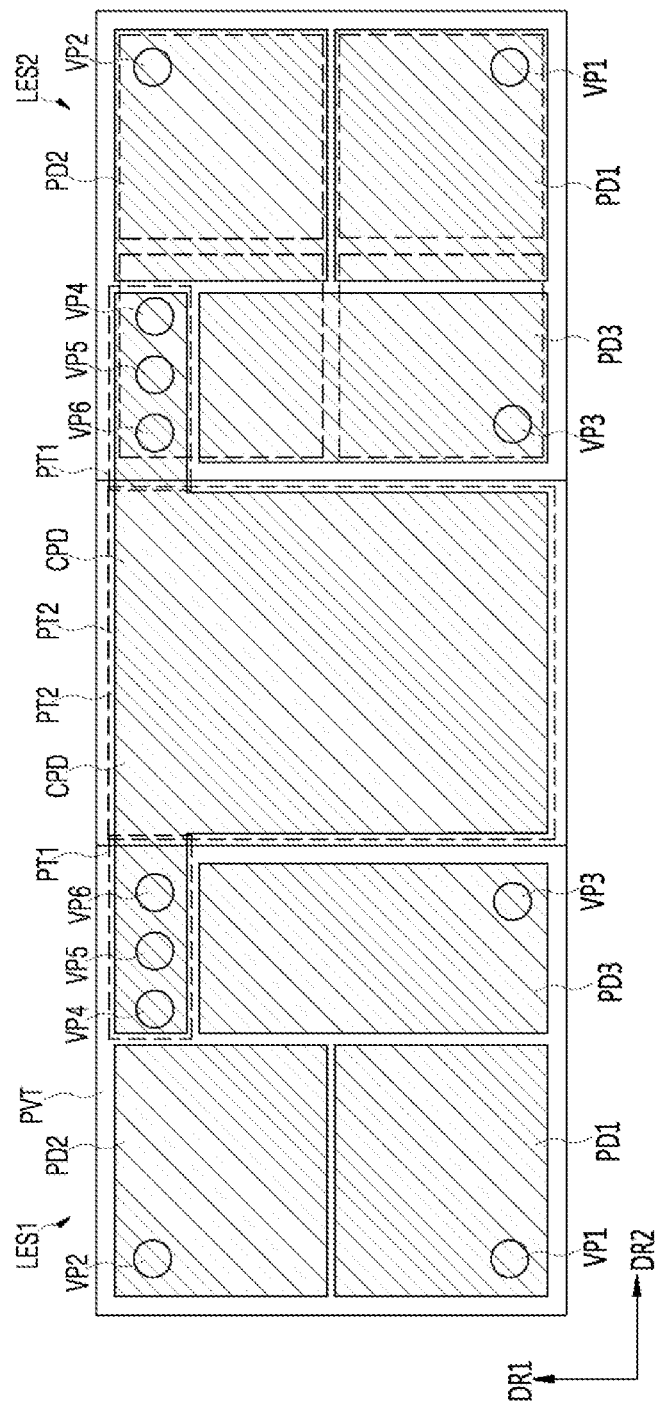

FIGS. 4A and 4B are top views of the light emitting devices shown in FIGS. 2B and 3B, according to exemplary embodiments.

According to another exemplary embodiment shown in FIG. 4A, a first common pad CPD has a side (e.g., a long side), which is substantially parallel to the first side of a dielectric structure DES, and a second common pad CPD also has a side (e.g., a long side), which is substantially parallel to the first side of the dielectric structure. For example, when viewed from the top, the first common pad CPD may have an inverted L-shaped structure. As shown in FIG. 4A, the first light emitting structure LES1 and the second light emitting structure LES2 may have mirror image structures with respect to a virtual vertical side VL that intersects the center of the dielectric structure DES in a first direction DR1.

Referring to FIG. 4B, as described above, a first common pad CPD and a second common pad CPD may be integrated with each other as a single element.

Hereinafter, the disposition relationship of a first pad PD1, a second pad PD2, a third pad PD3, and a common pad CPD of each of a first light emitting structure LES1 and a second light emitting structure LES2 will be described through various exemplary embodiments.

FIGS. 5A, 5B, 6A, and 6B are top views of the pads of light emitting devices according to exemplary embodiments.

Figure 5A:
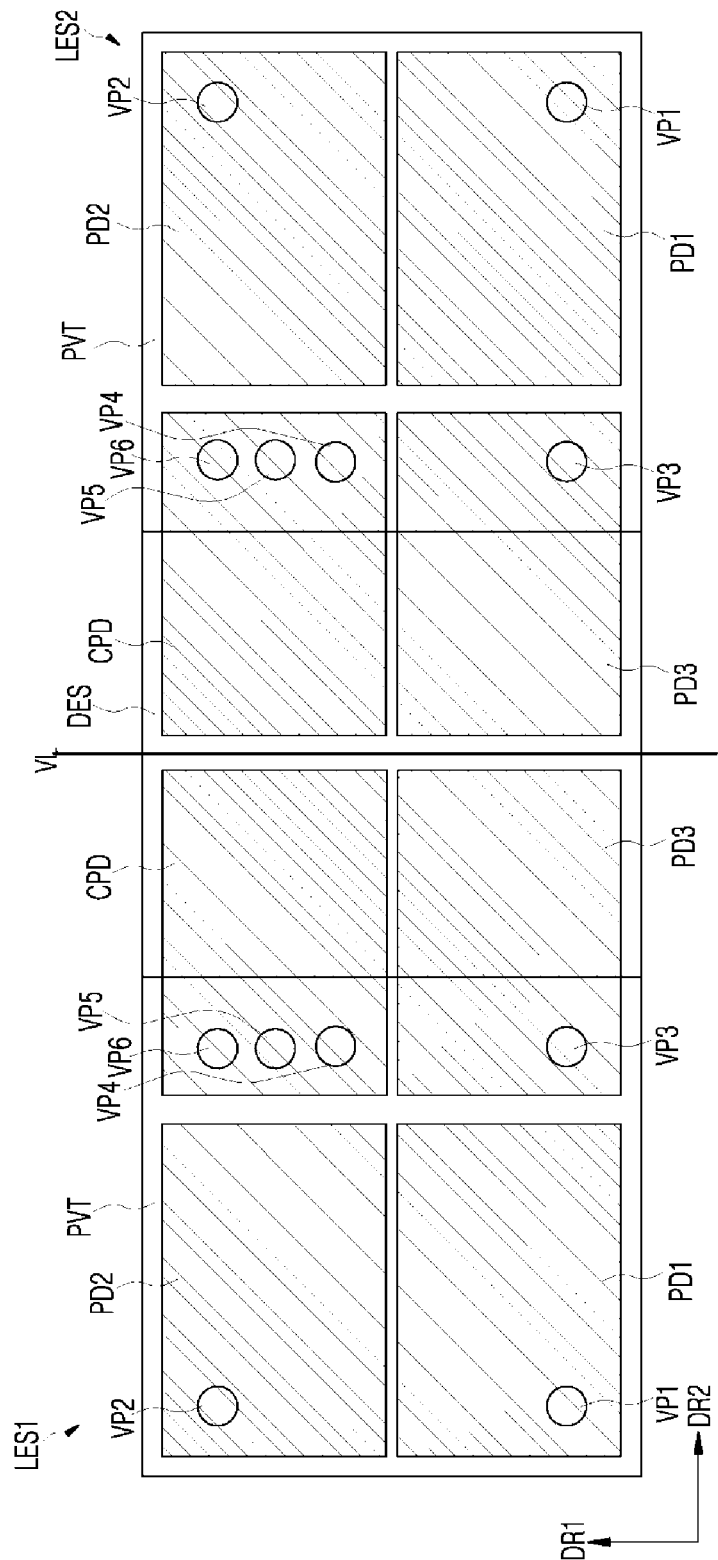
FIGS. 5A, 5B, 6A, and 6B are top views of pads of light emitting devices according to exemplary embodiments.
Figure 6A:
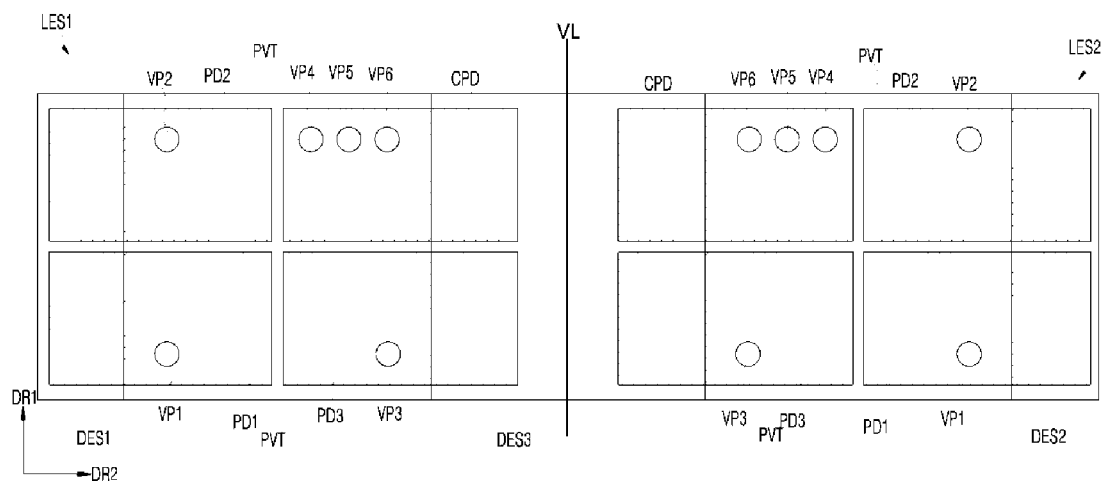

Referring to FIGS. 5A and 6A, the sizes of a first pad PD1, a second pad PD2, a third pad PD3, and a common pad CPD of each of a first light emitting structure LES1 and a second light emitting structure LES2 may be substantially the same.

Referring to FIG. 5A, a dielectric structure DES according to an exemplary embodiment may be disposed between the first light emitting structure LES1 and the second light emitting structure LES2. In the first light emitting structure LES1, each of the first pad PD1 and the second pad PD2 may be disposed within the top surface of the first light emitting structure LES1, and each of the third pad PD3 and the common pad CPD may extend from the top surface of the first light emitting structure LES1 to the top surface of the dielectric structure DES. In the second light emitting structure LES2, each of the first pad PD1 and the second pad PD2 may be within the top surface of the second light emitting structure LES2, and each of the third pad PD3 and the common pad CPD may extend from the top surface of the second light emitting structure LES2 to the top surface of the dielectric structure DES. The first light emitting structure LES1 and the second light emitting structure LES2 may have mirror image structures with respect to a virtual vertical line VL that intersects the center of the dielectric structure DES in a first direction DR1.

When viewed from the top, in the first light emitting structure LES1, as the first pad PD1, the second pad PD2, the third pad PD3, and the common pad CPD are extended in a second direction DR2, the positions of a first through pattern VP1, a second through pattern VP2, a third through pattern VP3, a fourth through pattern VP4, a fifth through pattern VP5, and a sixth through pattern VP6 may be changed depending on the respective dispositions of the first pad PD1, the second pad PD2, the third pad PD3, and the common pad CPD. For example, the third through pattern VP3 may be disposed at a periphery of the first light emitting structure LES1 adjacent to the dielectric structure DES, and each of the fourth through pattern VP4, the fifth through pattern VP5, and the sixth through pattern VP6 may be disposed at the periphery of the first light emitting structure LES1 adjacent to the dielectric structure DES. Since the positions of a first through pattern VP1, a second through pattern VP2, a third through pattern VP3, a fourth through pattern VP4, a fifth through pattern VP5, and a sixth through pattern VP6 of the second light emitting structure LES2 are substantially the same as those of the first light emitting structure LES1, repeated descriptions thereof will be omitted to avoid redundancy.

Figure 5B:
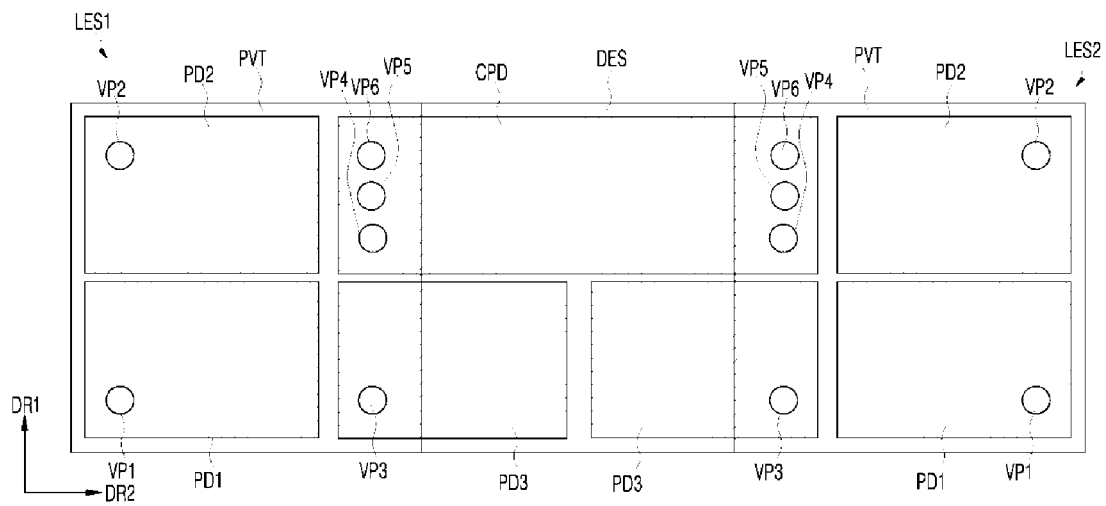

Referring to FIG. 5B, a light emitting device according to an exemplary embodiment may have an integral structure, in which a common pad CPD of a first light emitting structure LES1 and a common pad CPD of a second light emitting structure LES2 are integrated with each other.

Referring to FIG. 6A, a dielectric structure DES according to another exemplary embodiment may include a first dielectric structure DES1 disposed at one side of the first light emitting structure LES1, a second dielectric structure DES2 disposed at one side of the second light emitting structure LES2, and a third dielectric structure DES3 disposed between the first light emitting structure LES1 and the second light emitting structure LES2. In the first light emitting structure LES1, the first pad PD1 and the second pad PD2 may extend from the top surface of the first light emitting structure LES1 to the top surface of the first dielectric structure DES1. The third pad PD3 and the common pad CPD may extend from the top surface of the first light emitting structure LES1 to the top surface of the third dielectric structure DES3. In the second light emitting structure LES2, each of the first pad PD1 and the second pad PD2 may extend from the top surface of the second light emitting structure LES2 to the top surface of the second dielectric structure DES2. In the second light emitting structure LES2, each of the third pad PD3 and the common pad CPD may extend from the top surface of the second light emitting structure LES2 to the top surface of the third dielectric structure DES3. The first light emitting structure LES1 and the second light emitting structure LES2 may have mirror image structures with respect to a virtual vertical line VL that intersects the center of the third dielectric structure DES3 in a first direction DR1.

When viewed from the top, in the first light emitting structure LES1 of FIG. 6A, since portions of the first pad PD1, the second pad PD2, the third pad PD3, and the common pad CPD occupy the top surface of the first light emitting structure LES1 by being disposed on four substantially equal areas of the first light emitting structure LES1, the positions of a first through pattern VP1, a second through pattern VP2, a third through pattern VP3, a fourth through pattern VP4, a fifth through pattern VP5, and a sixth through pattern VP6 may have a higher degree of layout freedom than those in the first light emitting structure LES1 of FIG. 5A. Since the positions of a first through pattern VP1, a second through pattern VP2, a third through pattern VP3, a fourth through pattern VP4, a fifth through pattern VP5, and a sixth through pattern VP6 of the second light emitting structure LES2 are substantially the same as those of the first light emitting structure LES1, repeated descriptions thereof will be omitted to avoid redundancy.

Figure 6B:
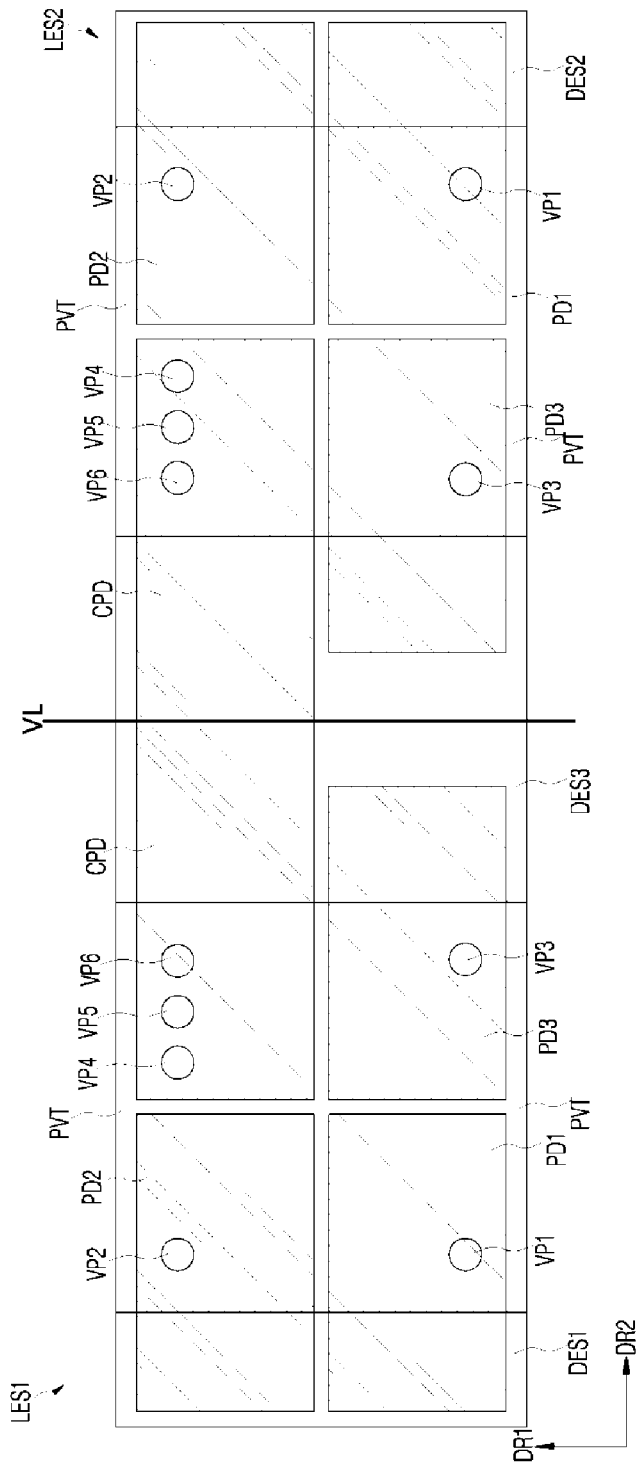

Referring to FIG. 6B, a light emitting device according to another exemplary embodiment may have an integral structure, in which a common pad CPD of a first light emitting structure LES1 and a common pad CPD of a second light emitting structure LES2 are integrated with each other. Since other elements of the first and second light emitting structures LES1 and LES2

Figure 7A:
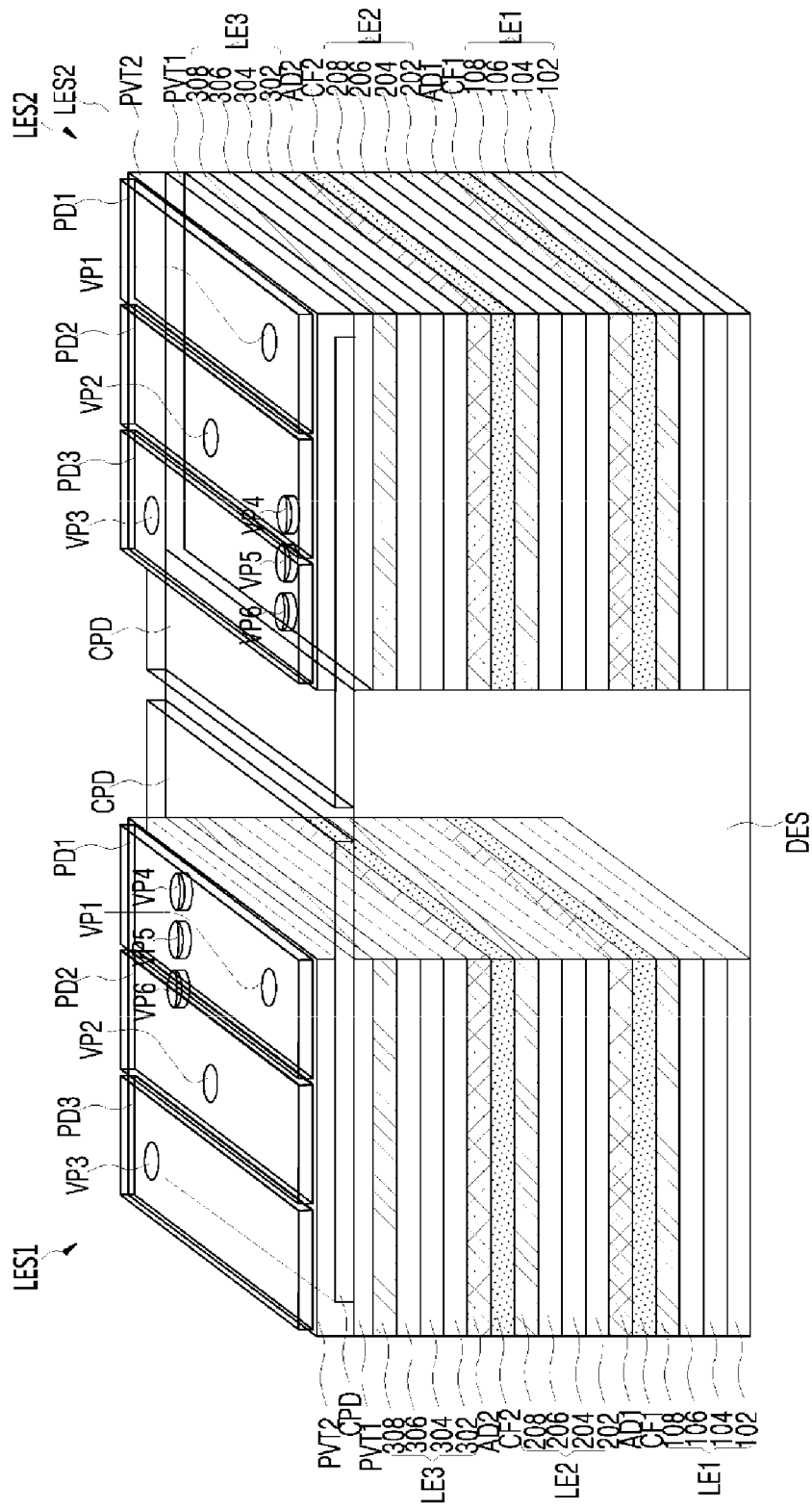
FIG. 7A is a perspective view of a light emitting device according to another exemplary embodiment.
Figure 7B:
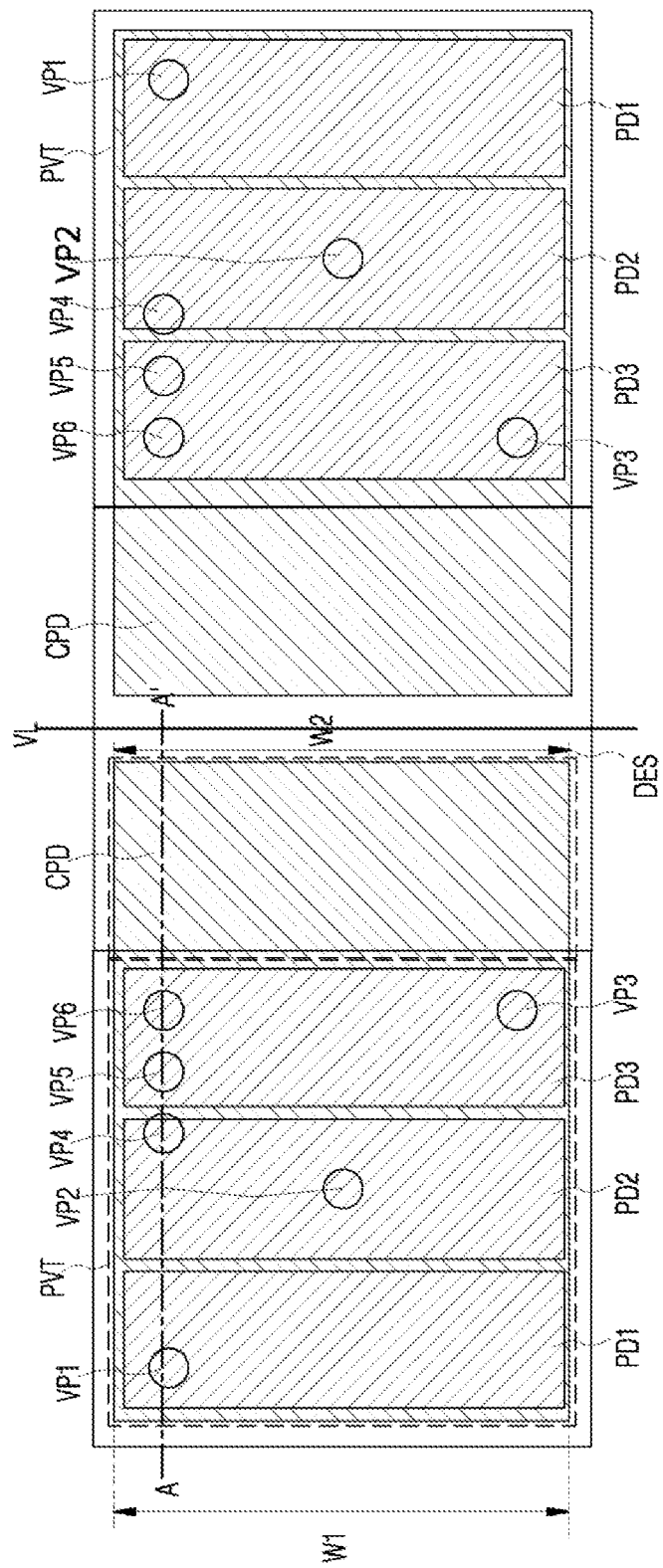
FIG. 7B is a top view of the light emitting device shown in FIG. 7A.
Figure 7C:
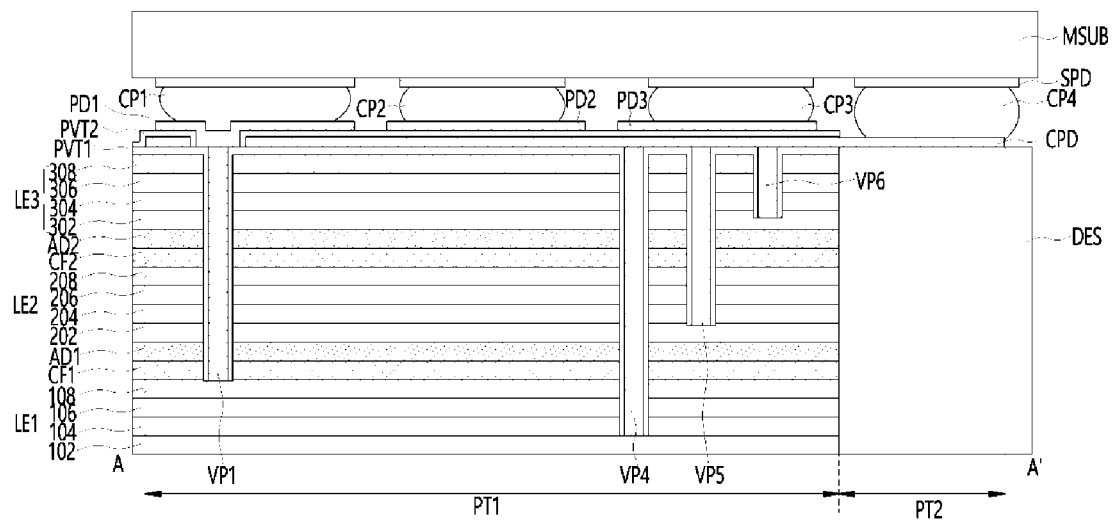
FIG. 7C is a cross-sectional view taken along line A-A' of FIG. 7B.
Figure 7D:
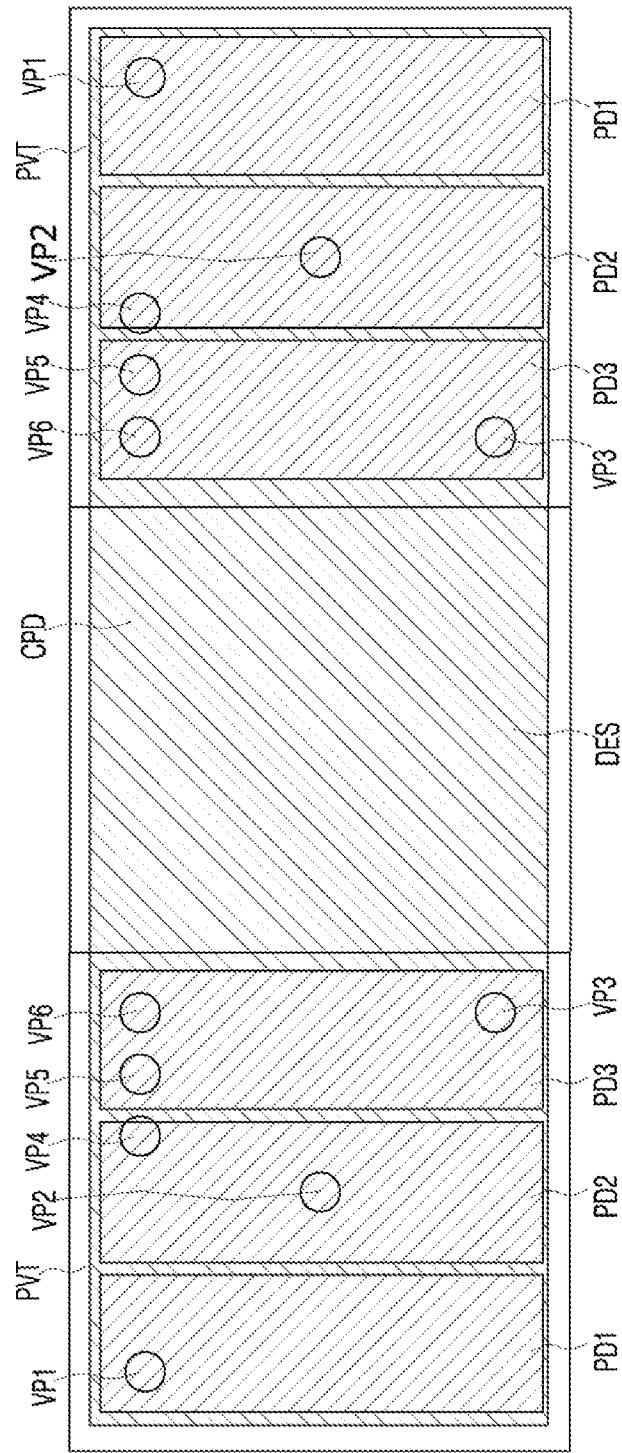
FIG. 7D is a top view of the light emitting device shown in FIG. 7B according to another exemplary embodiment

FIG. 7A is a perspective view of a light emitting device according to another exemplary embodiment, FIG. 7B is a top view of the light emitting device shown in FIG. 7A, and FIG. 7C is a cross-sectional view taken along line A-A' of FIG. 7B. FIG. 7D is a top view of the light emitting device shown in FIG. 7B according to another exemplary embodiment.

Referring to FIGS. 7A, 7B, 7C, and 7D, a light emitting device may include a plurality of light emitting structures LES, each including a first light emitting part LE1, a second light emitting part LE2, and a third light emitting part LE3, and a dielectric structure DES disposed between the light emitting structures LES. The light emitting structures LES may include a first light emitting structure LES1 and a second light emitting structure LES2.

The first light emitting part LE1 may include a first n-type semiconductor layer 102, a first active layer 104, a first p-type semiconductor layer 106, and a first ohmic layer 108, the second light emitting part LE2 may include a second n-type semiconductor layer 202, a second active layer 204, a second p-type semiconductor layer 206, and a second ohmic layer 208, and the third light emitting part LE3 may include a third n-type semiconductor layer 302, a third active layer 304, a third p-type semiconductor layer 306, and a third ohmic layer 308.

Each of the first light emitting structure LES1 and the second light emitting structure LES2 may further include a first color filter CF1 and a first bonding part AD1, which are disposed between the first light emitting part LE1 and the second light emitting part LE2, and a second color filter CF2 and a second bonding part AD2, which are disposed between the second light emitting part LE2 and the third light emitting part LE3.

Each of the first light emitting structure LES1 and the second light emitting structure LES2 may further include a first passivation layer PVT1, which is disposed on the third light emitting part LE3. The first passivation layer PVT1 may include at least one of $SiN_x$, $TiN_x$, $TiO_x$, $TaO_x$, $ZrO_x$, $HfO_x$, $Al_xO_y$, and $SiO_x$. According to an exemplary embodiment, the top surface of the first passivation layer PVT1 may be coplanar with the top surface of the dielectric structure DES. In some exemplary embodiments, the first passivation layer PVT1 and the dielectric structure DES may be integrated with each other.

Each of the first light emitting structure LES1 and the second light emitting structure LES2 may further include a first through pattern VP1 passing through the first passivation layer PVT1, the third light emitting part LE3, the second bonding part AD2, the second color filter CF2, the second light emitting part LE2, the first bonding part AD1, and the first color filter CF1 and is electrically coupled with the first ohmic layer 108, a second through pattern VP2 passing through the first passivation layer PVT1, the third light emitting part LE3, the second bonding part AD2, and the second color filter CF2 and is electrically coupled with the second ohmic layer 208, and a third through pattern VP3 passing through the first passivation layer PVT1 and is electrically coupled with the third ohmic layer 308.

Also, each of the first light emitting structure LES1 and the second light emitting structure LES2 may further include a fourth through pattern VP4 passing through the first passivation layer PVT1, the third light emitting part LE3, the second bonding part AD2, the second color filter CF2, the second light emitting part LE2, the first bonding part AD1, the first color filter CF1, the first ohmic layer 108, the first p-type semiconductor layer 106, and the first active layer 104 and is electrically coupled with the first n-type semiconductor layer 102, a fifth through pattern VP5 passing through the first passivation layer PVT1, the third light emitting part LE3, the second bonding part AD2, the second color filter CF2, the second ohmic layer 208, the second p-type semiconductor layer 206, and the second active layer 204 and is electrically coupled with the second n-type semiconductor layer 202, and a sixth through pattern VP6 passing through the first passivation layer PVT1, the third ohmic layer 308, the third p-type semiconductor layer 306, and the third active layer 304 and is electrically coupled with the third n-type semiconductor layer 302.

Each of the first light emitting structure LES1 and the second light emitting structure LES2 may further include a common pad CPD, which is electrically coupled in common with the fourth through pattern VP4, the fifth through pattern VP5, and the sixth through pattern VP6, covers the first passivation layer PVT1, and extends to the top surface of the dielectric structure DES. According to an exemplary embodiment, the common pad CPD of the first light emitting structure LES1 may include a first portion PT1 disposed on the first passivation layer PVT1, and a second portion PT2 extending from the first portion PT1 to the top surface of the dielectric structure DES. The first portion PT1 of the common pad CPD may partially or entirely cover the first passivation layer PVT1. For example, the first portion PT1 of the common pad CPD may have a first width W1, and the second portion PT2 may have a second width W2 that is substantially the same as the first width W1. Since the common pad CPD of the second light emitting structure LES2 has substantially the same structure as the common pad CPD of the first light emitting structure LES1, repeated descriptions thereof will be omitted to avoid redundancy.

According to an exemplary embodiment, the common pad CPD may include holes that respectively expose the first through pattern VP1, the second through pattern VP2, and the third through pattern VP3. Each of the first light emitting structure LES1 and the second light emitting structure LES2 may further include a second passivation layer PVT2 disposed on the common pad CPD. The second passivation layer PVT2 may include at least one of $SiN_x$, $TiN_x$, $TiO_x$, $TaO_x$, $ZrO_x$, $HfO_x$, $Al_xO_y$, and $SiO_x$. The second passivation layer PVT2 may cover the side surfaces of the holes and expose the first through pattern VP1, the second through pattern VP2, and the third through pattern VP3 at the bottom of the holes. According to an exemplary embodiment, the second passivation layer PVT2 may extend on the common pad CPD to surround the respective outer sidewalls of the first through pattern VP1, the second through pattern VP2, and the third through pattern VP3.

Each of the first light emitting structure LES1 and the second light emitting structure LES2 may further include a first pad PD1, a second pad PD2, and a third pad PD3 disposed in the holes of the common pad CPD formed with the second passivation layer PVT2, and are electrically coupled with each of the first light emitting part LE1, the second light emitting part LE2, and the third light emitting part LE3.

As such, each of the first pad PD1, the second pad PD2, and the third pad PD3 may be electrically insulated from the common pad CPD by the second passivation layer PVT2, and may be disposed on a plane different from that on which the common pad CPD is disposed. Also, each of the first pad PD1, the second pad PD2, and the third pad PD3 may be electrically insulated from the fourth through pattern VP4, the fifth through pattern VP5, and the sixth through pattern VP6 by the first passivation layer PVT1 and the second passivation layer PVT2, and may be disposed on a plane different from that on which the fourth through pattern VP4, the fifth through pattern VP5, and the sixth through pattern VP6 are disposed. As such, the fourth through pattern VP4, the fifth through pattern VP5, and the sixth through pattern VP6 may be disposed without being confined to a particular area of the first light emitting structure LES1, so long as they are separated from one another. More particularly, the respective positions of the fourth through pattern VP4, fifth through pattern VP5, and the sixth through pattern VP6 are not limited to those shown in FIGS. 7A, 7B, and 7C.

According to an exemplary embodiment, the first through pattern VP1, the second through pattern VP2, and the third through pattern VP3 may be disposed on a virtual diagonal line that intersects the center of the second passivation layer PVT2. However, the inventive concepts are not limited thereto, and in some exemplary embodiments, each of the first through pattern VP1, the second through pattern VP2, and the third through pattern VP3 may be disposed to not overlap with the fourth through pattern VP4, the fifth through pattern VP5, and the sixth through pattern VP6. As such, the respective dispositions of the first through pattern VP1, the second through pattern VP2, and the third through pattern VP3 are not particularly limited.

Each of the first light emitting structure LES1 and the second light emitting structure LES2 may further include a first pad PD1, a second pad PD2, and a third pad PD3 spaced apart from each other and disposed on the second passivation layer PVT2 in substantially the same areas by dividing the area of the second passivation layer PVT2 into three equal parts, for example. According to an exemplary embodiment, each of the first pad PD1, the second pad PD2, and the third pad PD3 may have substantially a rectangular structure extending in a first direction DR1 or a second direction DR2.

As described above, as the common pad CPD is disposed at a level different from each of the first pad PD1, the second pad PD2, and the third pad PD3 and has a structure that extends to the top surface of the dielectric structure DES, the common pad CPD may extend to the top surface of the dielectric structure DES while being electrically coupled with the fourth through pattern VP4, the fifth through pattern VP5, and the sixth through pattern VP6. In this manner, it is possible to secure a sufficient area for the common pad CPD that is to be brought into contact with a pad of a mounting substrate.

Moreover, as the first pad PD1, the second pad PD2, and the third pad PD3 are disposed to be separated from one another in substantially equal three areas, a wider area may be secured to form the first, second, and third pads PD1, PD2, and PD3, as compared to when the first, second, and third pads PD1, PD2, and PD3 are to be formed in four equal areas of the first light emitting structure LES1.

Referring to FIG. 7C, the light emitting device described above with reference to FIGS. 7A and 7B is mounted to a mounting substrate MSUB to form a light emitting module.

The light emitting module may include a first conductive part CP1, a second conductive part CP2, a third conductive part CP3, and a fourth conductive part CP4, which are electrically coupled with the first pad PD1, the second pad PD2, the third pad PD3, and the common pad CPD, respectively, on the first pad PD1, the second pad PD2, the third pad PD3, and the common pad CPD. Each of the first conductive part CP1, the second conductive part CP2, the third conductive part CP3, and the fourth conductive part CP4 may be a solder ball including metal, such as In, Sn, Ni, and Cu. At least one among the first conductive part CP1, the second conductive part CP2, the third conductive part CP3, and the fourth conductive part CP4 may be disposed on the dielectric structure DES. For example, the fourth conductive part CP4 may be disposed on the dielectric structure DES. In some exemplary embodiments, a portion of the fourth conductive part CP4 may extend onto the light emitting structure LES.

The first conductive part CP1, the second conductive part CP2, the third conductive part CP3, and the fourth conductive part CP4 may be electrically coupled with pads SPD of the mounting substrate MSUB, such as a circuit board.

Referring to FIG. 7D, a light emitting device according to another exemplary embodiment may have an integral structure, in which a common pad CPD of a first light emitting structure LES1 and a common pad CPD of a second light emitting structure LES2 are integrated with each other.

Figure 8A:
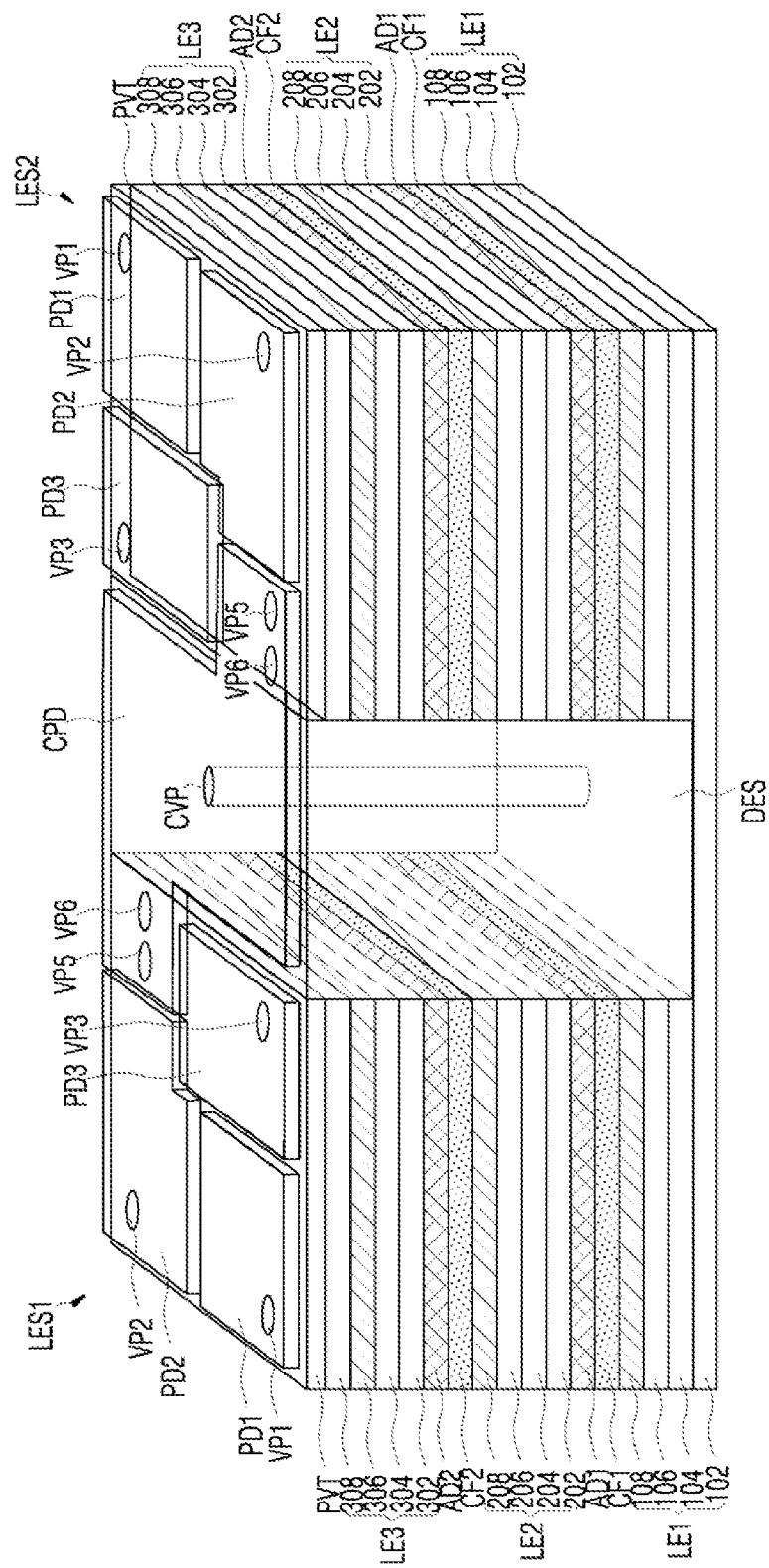
FIG. 8A is a perspective view a light emitting device according to still another exemplary embodiment.
Figure 8B:
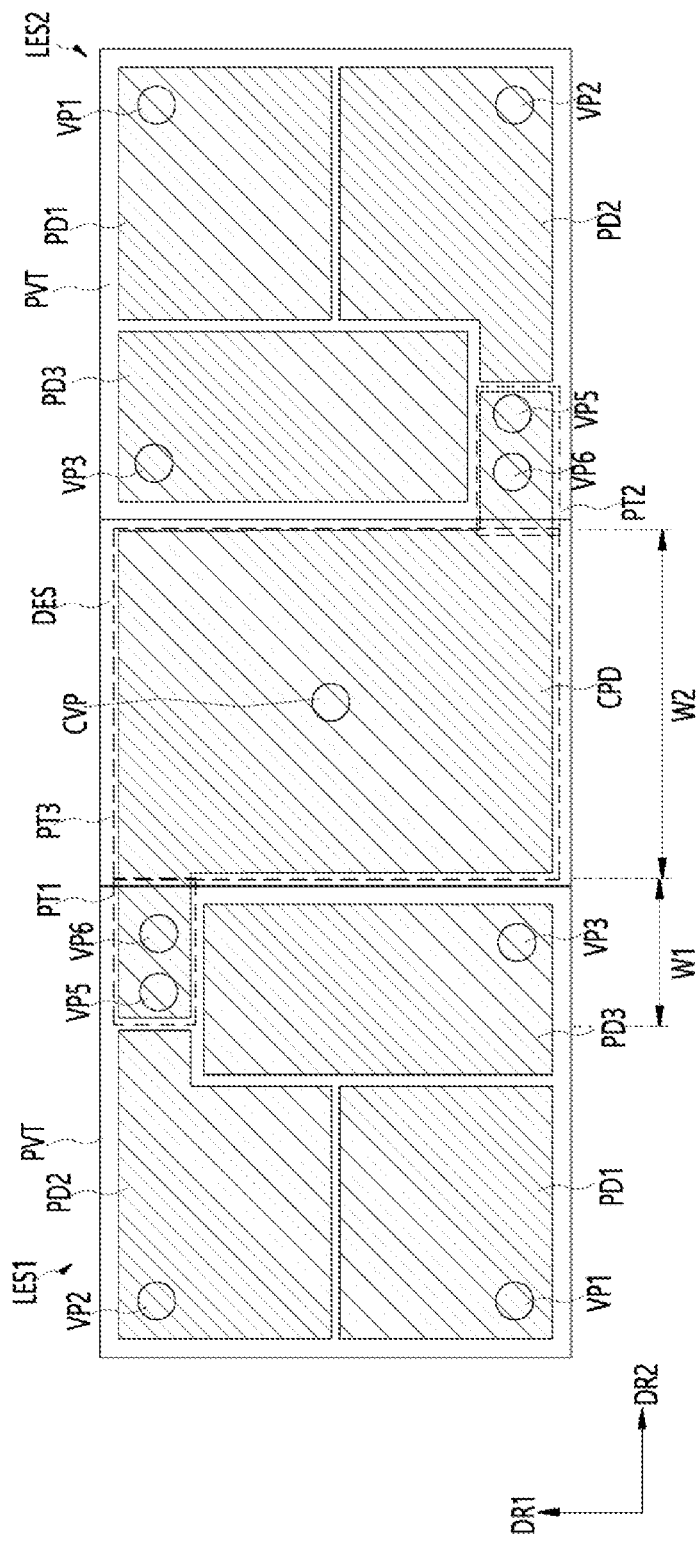
FIG. 8B is a top view of the light emitting device shown in FIG. 8A.

FIG. 8A is a perspective view of a light emitting device according to another exemplary embodiment, and FIG. 8B is a top view of the light emitting device shown in FIG. 8A.

Referring to FIGS. 8A and 8B, a light emitting device may include a plurality of light emitting structures LES each including a first light emitting part LE1, a second light emitting part LE2, and a third light emitting part LE3, and a dielectric structure DES disposed between the light emitting structures LES. The light emitting structures LES may include a first light emitting structure LES1 and a second light emitting structure LES2.

In the first light emitting structure LES1, the first light emitting part LE1 may include a first n-type semiconductor layer 102, a first active layer 104, a first p-type semiconductor layer 106, and a first ohmic layer 108, the second light emitting part LE2 may include a second ohmic layer 208, a second p-type semiconductor layer 206, a second active layer 204, and a second n-type semiconductor layer 202, and the third light emitting part LE3 may include a third ohmic layer 308, a third p-type semiconductor layer 306, a third active layer 304, and a third n-type semiconductor layer 302. The first light emitting structure LES1 may further include a passivation layer PVT, which is disposed on the third light emitting part LE3.

In the second light emitting structure LES2, the first light emitting part LE1 may include a first n-type semiconductor layer 102, a first active layer 104, a first p-type semiconductor layer 106, and a first ohmic layer 108, the second light emitting part LE2 may include a second ohmic layer 208, a second p-type semiconductor layer 206, a second active layer 204, and a second n-type semiconductor layer 202, and the third light emitting part LE3 may include a third ohmic layer 308, a third p-type semiconductor layer 306, a third active layer 304, and a third n-type semiconductor layer 302. The first light emitting structure LES1 may further include a passivation layer PVT, which is disposed on the third light emitting part LE3.

According to the illustrated exemplary embodiment, the first n-type semiconductor layer 102 of the first light emitting structure LES1 and the first n-type semiconductor layer 102 of the second light emitting structure LES2 may be an integral type by being coupled with each other. Hereinafter, the first n-type semiconductor layer 102 of the first light emitting structure LES1 and the first n-type semiconductor layer 102 of the second light emitting structure LES2 coupled with each other will be referred to as a common first n-type semiconductor layer 102.

According to an exemplary embodiment, the dielectric structure DES disposed on the common first n-type semiconductor layer 102 may insulate the first light emitting structure LES1 and the second light emitting structure LES2 from each other. The top surface of the dielectric structure DES may be coplanar with the top surface of each of the first light emitting structure LES1 and the second light emitting structure LES2. For example, the top surface of the passivation layer PVT may be coplanar with the top surface of the dielectric structure DES. In some exemplary embodiments, the passivation layer PVT and the dielectric structure DES may be integrated with each other.

Each of the first light emitting structure LES1 and the second light emitting structure LES2 may further include a first color filter CF1 and a first bonding part AD1, which are disposed between the first light emitting part LE1 and the second light emitting part LE2, and a second color filter CF2 and a second bonding part AD2, which are disposed between the second light emitting part LE2 and the third light emitting part LE3.

Each of the first light emitting structure LES1 and the second light emitting structure LES2 may further include a passivation layer PVT disposed over the third light emitting part LE3. The passivation layer PVT may include at least one of $SiN_x$, $TiN_x$, $TiO_x$, $TaO_x$, $ZrO_x$, $HfO_x$, $Al_xO_y$, and $SiO_x$. According to an exemplary embodiment, the top surface of the passivation layer PVT may be coplanar with the top surface of the dielectric structure DES. In some exemplary embodiments, the passivation layer PVT and the dielectric structure DES may be integrated with each other.

Each of the first light emitting structure LES1 and the second light emitting structure LES2 may further include a first through pattern VP1 passing through the passivation layer PVT, the third light emitting part LE3, the second bonding part AD2, the second color filter CF2, the second light emitting part LE2, the first bonding part AD1, and the first color filter CF1 and is electrically coupled with the first ohmic layer 108, a second through pattern VP2 passing through the passivation layer PVT, the third light emitting part LE3, the second bonding part AD2, and the second color filter CF2 and is electrically coupled with the second ohmic layer 208, and a third through pattern VP3 passing through the passivation layer PVT and is electrically coupled with the third ohmic layer 308. In some exemplary embodiments, the third through pattern VP3 may be omitted. Also, each of the first light emitting structure LES1 and the second light emitting structure LES2 may further include a fifth through pattern VP5 passing through the passivation layer PVT, the third light emitting part LE3, the second bonding part AD2, the second color filter CF2, the second ohmic layer 208, the second p-type semiconductor layer 206, and the second active layer 204 and is electrically coupled with the second n-type semiconductor layer 202, and the sixth through pattern VP6 passing through the third ohmic layer 308, the third p-type semiconductor layer 306, and the third active layer 304 and is electrically coupled with the third n-type semiconductor layer 302.

According to an exemplary embodiment, the light emitting device may further include a common through pattern CVP, which passes through the dielectric structure DES and is electrically coupled with the common first n-type semiconductor layer 102.

Each of the first light emitting structure LES1 and the second light emitting structure LES2 may further include a first pad PD1, a second pad PD2, and a third pad PD3, which are disposed within the top surface of the passivation layer PVT, and a common pad CPD, which extends from the passivation layer PVT to the top surface of the dielectric structure DES. According to an exemplary embodiment, the common pad CPD of the first light emitting structure LES1 and the common pad CPD of the second light emitting structure LES2 may be an integral type by being integrated with each other. According to another exemplary embodiment, the common pad CPD of the first light emitting structure LES1 and the common pad CPD of the second light emitting structure LES2 may be separated from each other.

In each of the first light emitting structure LES1 and the second light emitting structure LES2, the first pad PD1 may be brought into electrical contact with the first through pattern VP1, the second pad PD2 may be brought into electrical contact with the second through pattern VP2, and the third pad PD3 may be brought into electrical contact with the third through pattern VP3.

According to an exemplary embodiment, the common pad CPD in the first light emitting structure LES1 and the second light emitting structure LES2 may include a first portion PT1, which is brought into electrical contact in common with the fifth through pattern VP5 and the sixth through pattern VP6 of the first light emitting structure LES1, a second portion PT2, which is brought into electrical contact in common with the fifth through pattern VP5 and the sixth through pattern VP6 of the second light emitting structure LES2, and a third portion PT3 coupling the first portion PT1 and the second portion PT2 and is brought into electrical contact with the common through pattern CVP4. The first portion PT1 and the second portion PT2 may have substantially the same area. The third portion PT3 may have an area greater than the first portion PT1 and the second portion PT2. For example, each of the first portion PT1 and the second portion PT2 may have a first width W1, and the third portion PT3 may have a second width W2 greater than the first width W1.

According to an exemplary embodiment, in the first light emitting structure LES1 and the second light emitting structure LES2, each of the first pad PD1, the second pad PD2, and the third pad PD3 may have an area greater than the area of each of the first portion PT1 and the second portion PT2 of the common pad CPD. For example, each of the first pad PD1, the second pad PD2, and the third pad PD3 may have a width greater than the first width W1. In some exemplary embodiments, the first pad PD1, the second pad PD2, and the third pad PD3 may have the same or different areas from each other.

In the first light emitting structure LES1 and the second light emitting structure LES2, as the first portion PT1 of the common pad CPD is brought into contact with the fifth through pattern VP5 and the sixth through pattern VP6, the first portion PT1 according to the illustrated exemplary embodiment may be formed smaller than that formed to contact three through patterns, such as the fourth through pattern VP4, the fifth through pattern VP5, and the sixth through pattern VP6. Similarly, the area of the third portion PT3 of the common pad CPD may be reduced. Since the third portion PT3 of the common pad CPD, which is electrically coupled with the common through pattern CVP4, covers the top surface of the dielectric structure DES, it is possible to secure a sufficient area.

Since the area of each of the first portion PT1 and the second portion PT2 of the common pad CPD is reduced, the remaining area of each of the top surface of the first light emitting structure LES1 and the top surface of the second light emitting structure LES2 may be increased. In this manner, the first pad PD1, the second pad PD2, and the third pad PD3 may be formed on a wider area, for example, by dividing the top surface of the light emitting structure into three parts, which may increase the areas of the first pad PD1, the second pad PD2, and the third pad PD3.

Figure 9A:
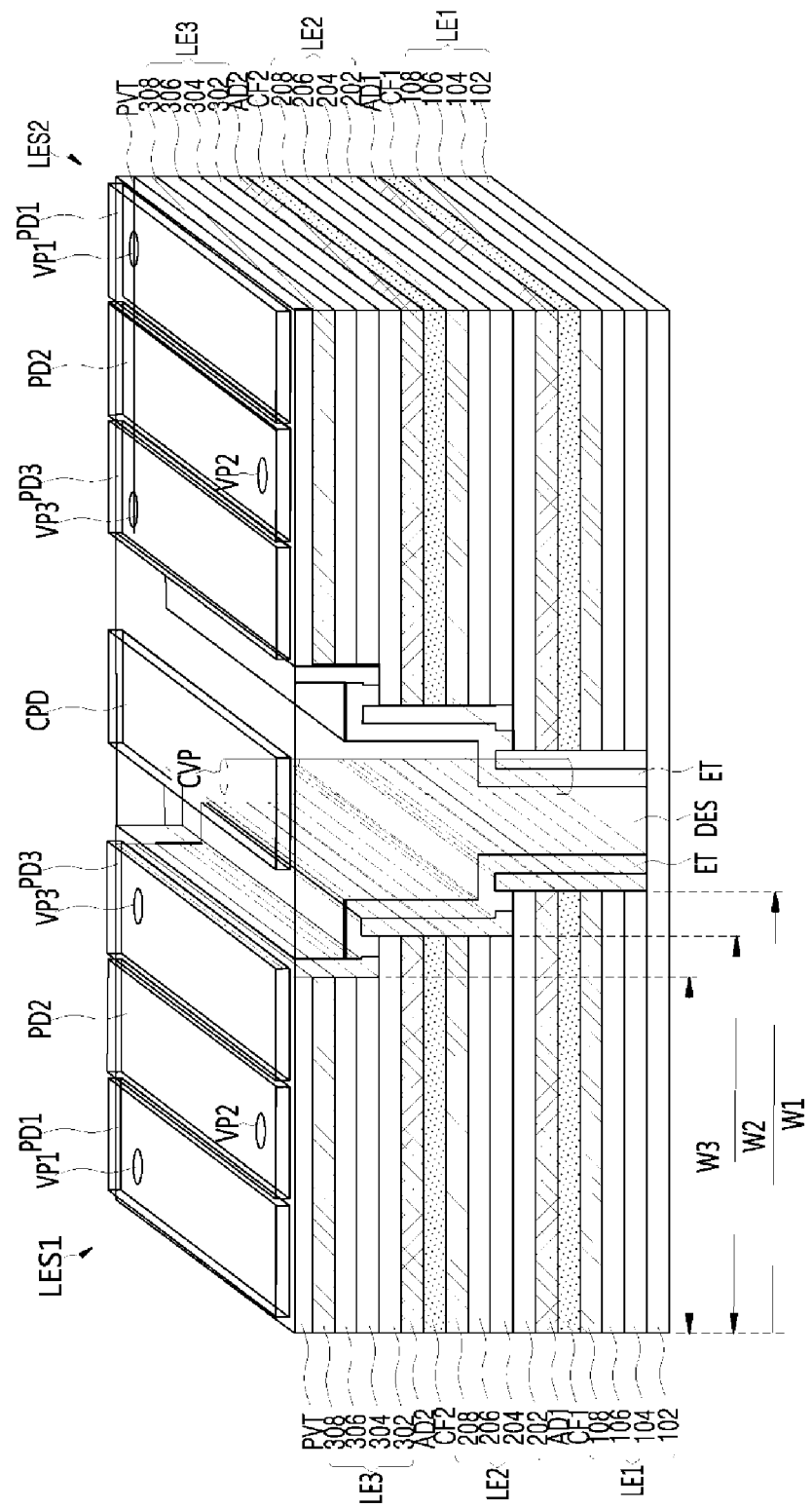
FIG. 9A is a perspective view of a light emitting device according to yet another exemplary embodiment.
Figure 9B:
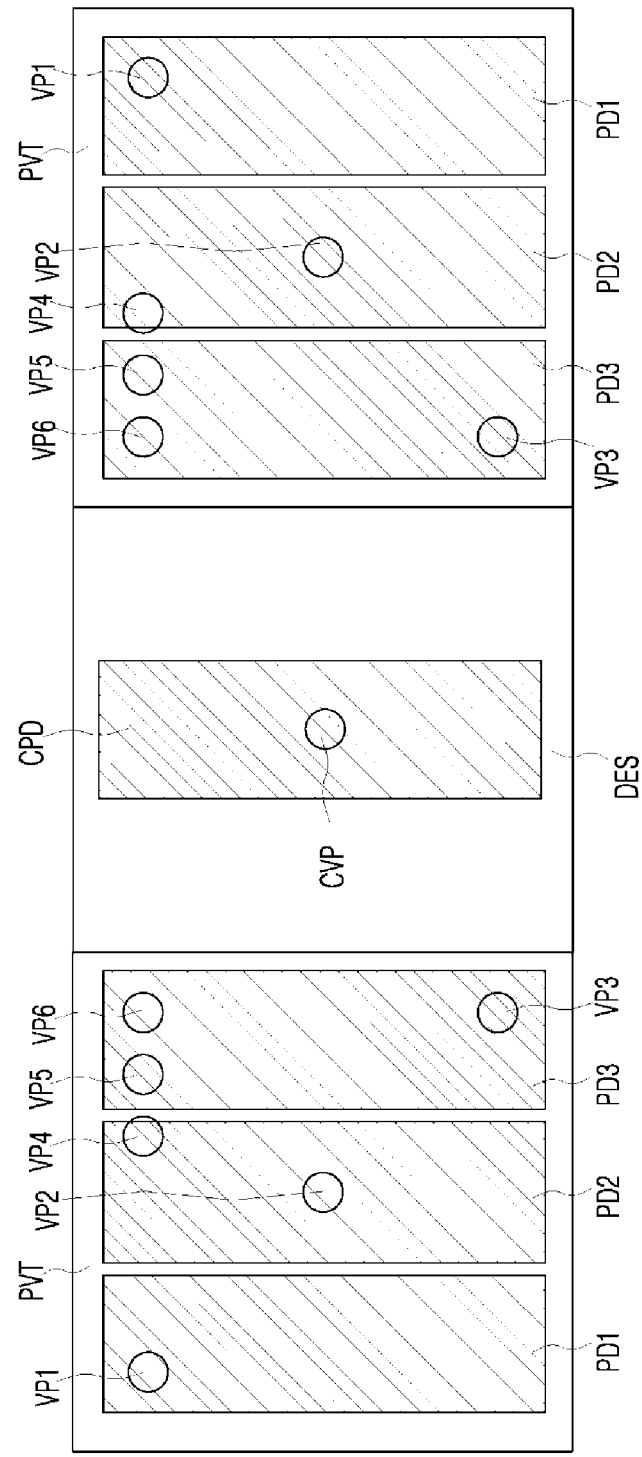
FIG. 9B is a top view of the light emitting device shown in FIG. 9A according to another exemplary embodiment.

FIG. 9A is a perspective view of a light emitting device according to another exemplary embodiment, and FIG. 9B is a top view of the light emitting device shown in FIG. 9A according to another exemplary embodiment.

For the cross-sectional view of the light emitting device of FIG. 9A, reference may be made to the cross-sectional view of FIG. 1C.

Referring to FIGS. 9A and 9B, a light emitting device may include a plurality of light emitting structures LES each including a first light emitting part LE1, a second light emitting part LE2, and a third light emitting part LE3, and a dielectric structure DES disposed between the light emitting structures LES. The light emitting structures LES may include a first light emitting structure LES1 and a second light emitting structure LES2.

In the first light emitting structure LES1, the first light emitting part LE1 may include a first n-type semiconductor layer 102, a first active layer 104, a first p-type semiconductor layer 106, and a first ohmic layer 108, the second light emitting part LE2 may include a second ohmic layer 208, a second p-type semiconductor layer 206, a second active layer 204, and a second n-type semiconductor layer 202, the third light emitting part LE3 may include a third ohmic layer 308, a third p-type semiconductor layer 306, a third active layer 304, and a third n-type semiconductor layer 302. The first light emitting structure LES1 may further include a passivation layer PVT, which is disposed on the third light emitting part LE3.

In the second light emitting structure LES2, the first light emitting part LE1 may include a first n-type semiconductor layer 102, a first active layer 104, a first p-type semiconductor layer 106, and a first ohmic layer 108, the second light emitting part LE2 may include a second ohmic layer 208, a second p-type semiconductor layer 206, a second active layer 204, and a second n-type semiconductor layer 202, and the third light emitting part LE3 may include a third ohmic layer 308, a third p-type semiconductor layer 306, a third active layer 304, and a third n-type semiconductor layer 302. The first light emitting structure LES1 may further include a passivation layer PVT, which is disposed on the third light emitting part LE3.

According to the illustrated exemplary embodiment, the first n-type semiconductor layer 102 of the first light emitting structure LES1 and the first n-type semiconductor layer 102 of the second light emitting structure LES2 may be integrated as an integral type by being coupled with each other. Hereinafter, the first n-type semiconductor layer 102 of the first light emitting structure LES1 and the first n-type semiconductor layer 102 of the second light emitting structure LES2 coupled to each other will collectively be referred to as a common first n-type semiconductor layer 102.

According to an exemplary embodiment, in each of the first light emitting structure LES1 and the second light emitting structure LES2, by partially etching the third light emitting part LE3, the second bonding part AD2, the second color fatter CF2, the second ohmic layer 208, the second p-type semiconductor layer 206, and the second active layer 204, the second n-type semiconductor layer 202 may be exposed. By partially etching the third ohmic layer 308, the third p-type semiconductor layer 306, and the third active layer 304, the third n-type semiconductor layer 302 may be exposed, by which a mesa structure may be formed. For example, each of the first active layer 104, the first p-type semiconductor layer 106, the first ohmic layer 108, the first color filter CF1, the first bonding part AD1, and the second n-type semiconductor layer 202 may have a first width W1. Each of the second active layer 204, the second p-type semiconductor layer 206, the second ohmic layer 208, the second color filter CF2, the second bonding part AD2, and the second n-type semiconductor layer 302 may have a second width W2 less than the first width W1. Each of the third active layer 304, the third p-type semiconductor layer 306, and the third ohmic layer 308 may have a third width W3 less than the second width W2.

According to an exemplary embodiment, the passivation layer PVT may cover the side surfaces of the third light emitting part LE3, the second light emitting part LE2, and the first light emitting part LE1. The passivation layer PVT may have a first hole exposing the second n-type semiconductor layer 202 and a second hole exposing the third n-type semiconductor layer 302.

According to an exemplary embodiment, the dielectric structure DES may be disposed on the common first n-type semiconductor layer 102 and insulate the first light emitting structure LES1 and the second light emitting structure LES2 from each other. The top surface of the dielectric structure DES may be coplanar with the top surface of each of the first light emitting structure LES1 and the second light emitting structure LES2. For example, the top surface of the passivation layer PVT may be coplanar with the top surface of the dielectric structure DES.

Each of the first light emitting structure LES1 and the second light emitting structure LES2 may further include a coupling pattern ET, which is disposed in the first hole and the second hole on the passivation layer PVT, and is electrically coupled with the common first n-type semiconductor layer 102. The coupling pattern ET may cover portions of the passivation layer PVT disposed on the side surfaces of the third light emitting part LE3, the second light emitting part LE2, and the first light emitting part LE1 and extend to the common first n-type semiconductor layer 102. The first n-type semiconductor layer 102, the second n-type semiconductor layer 202, and the third n-type semiconductor layer 302 may be electrically coupled with one another by the coupling pattern ET. In addition, the coupling pattern ET may include a reflective metal and may reflect light emitted from side surfaces of the light emitting structures.

Each of the first light emitting structure LES1 and the second light emitting structure LES2 may further include a first color filter CF1 and a first bonding part AD1, which are disposed between the first light emitting part LE1 and the second light emitting part LE2, and a second color filter CF2 and a second bonding part AD2, which are disposed between the second light emitting part LE2 and the third light emitting part LE3.

Each of the first light emitting structure LES1 and the second light emitting structure LES2 may further include a first through pattern VP1 passing through the passivation layer PVT, the third light emitting part LE3, the second bonding part AD2, the second color filter CF2, the second light emitting part LE2, the first bonding part AD1, and the first color filter CF1, and is electrically coupled with the first ohmic layer 108, a second through pattern VP2 passing through the passivation layer PVT, the third light emitting part LE3, the second bonding part AD2, and the second color filter CF2 and is electrically coupled with the second ohmic layer 208, and a third through pattern VP3 passing through the passivation layer PVT and is electrically coupled with the third ohmic layer 308. In some exemplary embodiments, the third through pattern VP3 may be omitted.

Each of the first light emitting structure LES1 and the second light emitting structure LES2 may further include a first pad PD1, a second pad PD2, and a third pad PD3, which are disposed on the top surface of the passivation layer PVT. The first pad PD1 may be brought into electrical contact with the first through pattern VP1, the second pad PD2 may be brought into electrical contact with the second through pattern VP2, and the third pad PD3 may be brought into electrical contact with the third through pattern VP3.

The light emitting device may further include a common through pattern CVP, which passes through the dielectric structure DES, and is electrically coupled with the common first n-type semiconductor layer 102. As the common through pattern CVP is electrically coupled with the common first n-type semiconductor layer 102, the common through pattern CVP may be electrically coupled with the second n-type semiconductor layer 202 and the third n-type semiconductor layer 302 through the coupling pattern ET, which is electrically coupled with the common first n-type semiconductor layer 102.

The light emitting device may further include a common pad CPD, which is disposed on the dielectric structure DES and is brought into electrical contact with the common through pattern CVP.

According to an exemplary embodiment, as the common pad CPD is disposed on the dielectric structure DES, the first pad PD1, the second pad PD2, and the third pad PD3 of the first light emitting structure LES1 may be disposed on portions of the top surface of the first light emitting structure LES1 that may be divided into three equal parts, for example. Depending on the disposition structure of the first pad PD1, the second pad PD2, and the third pad PD3, the disposition of the respective first through pattern VP1, second through pattern VP2, and third through pattern VP3 may be changed. For example, the first through pattern VP1 and the third through pattern VP3 may be disposed adjacent to one side of the light emitting device, and the second through pattern VP2 may be disposed adjacent to the other side of the light emitting device opposing one side. However, the inventive concepts are not limited to particular dispositions of the first through pattern VP1, the second through pattern VP2, and the third through pattern VP3. Since the first pad PD1, the second pad PD2, the third pad PD3, the first through pattern VP1, the second through pattern VP2, and the third through pattern VP3 of the second light emitting structure LES2 are substantially the same as those of the first light emitting structure LES1, repeated descriptions thereof will be omitted to avoid redundancy.

In this manner, as the common pad CPD does not overlap with the first light emitting structure LES1 and the second light emitting structure LES2, and is disposed on the dielectric structure DES, the first pad PD1, the second pad PD2, and the third pad PD3 of each of the first light emitting structure LES1 and the second light emitting structure LES2 may have increased areas.

Figure 9C:
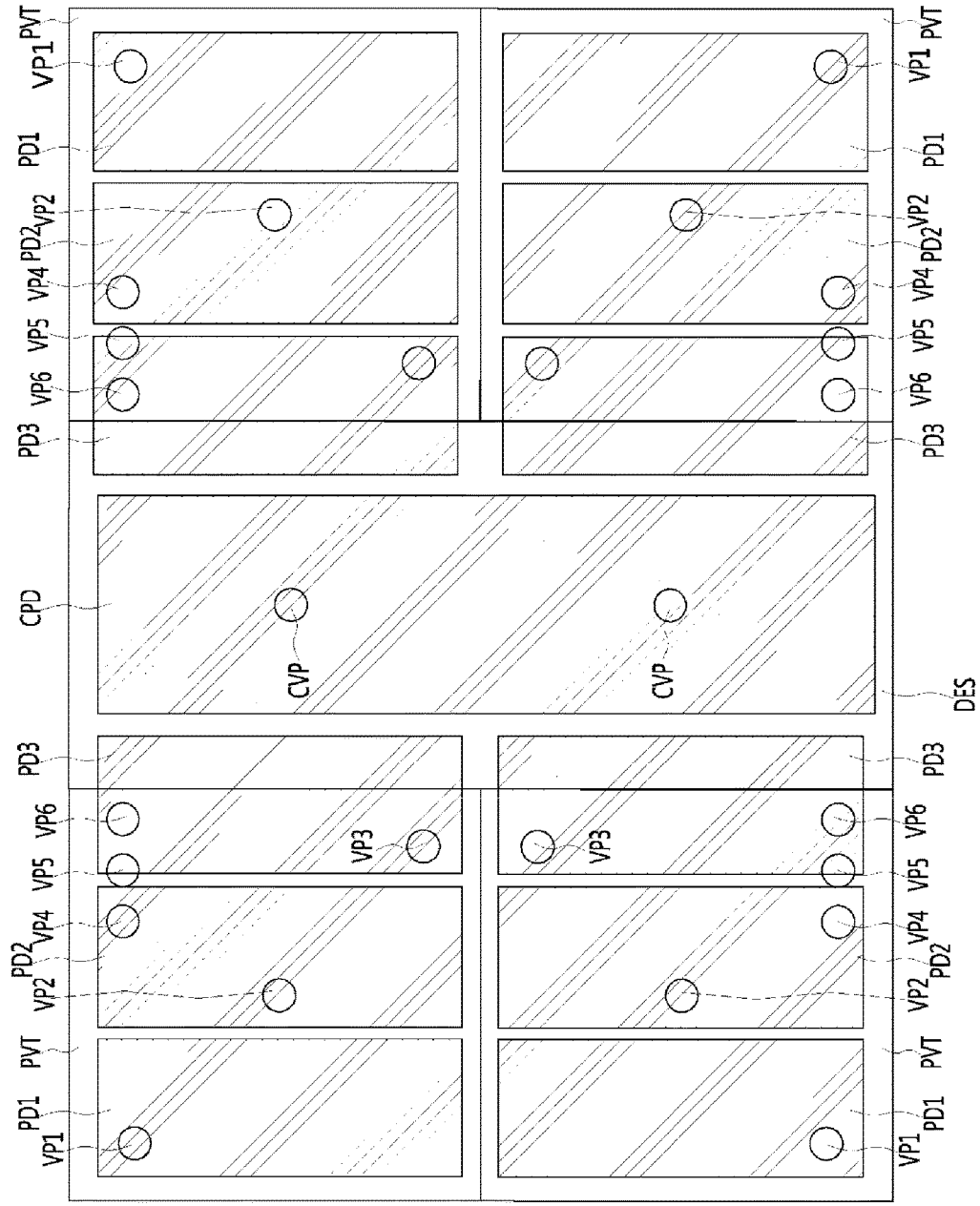
FIG. 9C is a plan view of the light emitting device shown in FIG. 9B according to another exemplary embodiment.

FIG. 9C is a top view of the light emitting device shown in FIG. 9B according to another exemplary embodiment. In FIG. 9C, the light emitting device will exemplarily be described as having four light emitting structures LES.

Referring to FIG. 9C, by increasing the areas of the respective first pad PD1, second pad PD2, and third pad PD3, the light emitting device may have a structure, in which the first pad PD1, the second pad PD2, and the third pad PD3 are extended to the top surface of the dielectric structure DES. In this case, when the first pad PD1 is brought into electrical contact with the first through pattern VP1, the second pad PD2 is brought into electrical contact with the second through pattern VP2, and the third pad PD3 is brought into electrical contact with the third through pattern VP3, the respective sizes and dispositions of the first pad PD1, the second pad PD2 and the third pad PD3, may be variously formed.

The common pad CP may electrically couple in common the first n-type semiconductor layer 102, the second n-type semiconductor layer 202, and the third n-type semiconductor layer 302 of each of the four light emitting structures LES.

While the light emitting device according to exemplary embodiments is described as including two light emitting structures LES, however, the inventive concepts are not limited to a particular number of the light emitting structures therein. For example, according to another exemplary embodiment, a light emitting device may include four light emitting structures LES as shown in FIG. 9C, or may include one or more than light emitting structures LES.

Hereinafter, a method for manufacturing a light emitting device according to an exemplary embodiment will be described. In the illustrated exemplary embodiment, the light emitting device will be described with reference to that shown in FIGS. 1A to 1C.

FIGS. 10A to 14A are top views illustrating a method for manufacturing a light emitting device according to an exemplary embodiment, and FIGS. 10B to 14B are cross-sectional views taken along lines A-A' of FIGS. 10A to 14A. FIG. 15 is a cross-sectional view illustrating the light emitting device of FIG. 14B mounted to a mounting substrate.

Figure 10A:
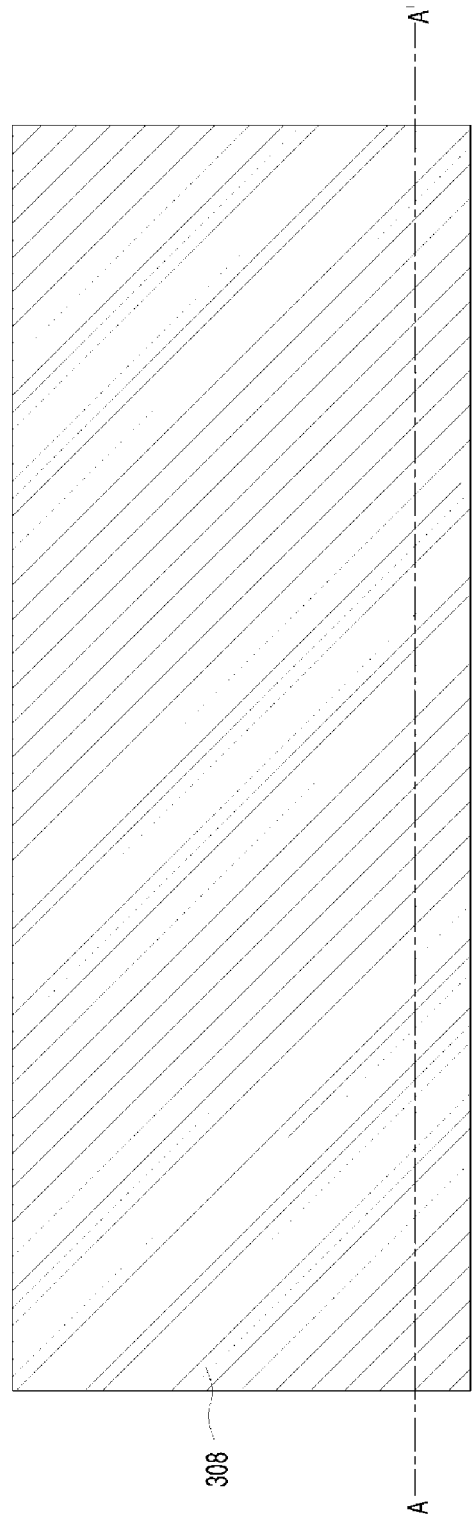
FIGS. 10A, 11A, 12A, 13A, and 14A are top views illustrating a method for manufacturing a light emitting device according to an exemplary embodiment.
Figure 10B:
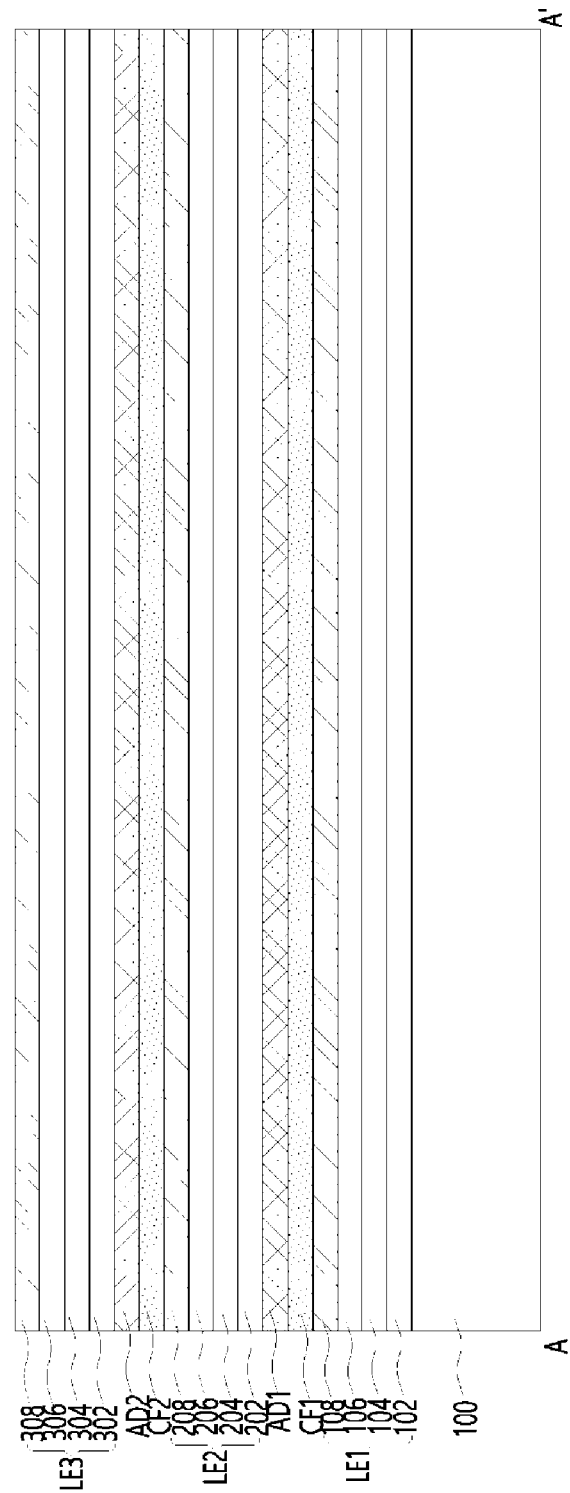
FIGS. 10B, 11B, 12B, 13B, and 14B are cross-sectional views taken along lines A-A' of FIGS. 10A, 11A, 12A, 13A, and 14A, respectively.

Referring to FIGS. 10A and 10B, by sequentially forming a first n-type semiconductor layer 102, a first active layer 104, and a first p-type semiconductor layer 106 on a first substrate 100 by using a growing method, such as MOCVD (metal organic chemical vapor deposition), MBE (molecular beam epitaxy), HVPE (hydride vapor phase epitaxy), and MOC (metal-organic chloride), and by forming a first ohmic layer 108 on the first p-type semiconductor layer 106 through a chemical vapor deposition (CVD) process, a physical vapor deposition (PVD), and the like, a first light emitting part LE1 may be formed.

A first color filter CF1 and a first bonding part AD1 may be formed on the first light emitting part LE1. In some exemplary embodiments, the first color filter CF1 may be selectively omitted.

By sequentially forming a second n-type semiconductor layer 202, a second active layer 204, and a second p-type semiconductor layer 206 on a second substrate by using a growing method, such as MOCVD, MBE, HVPE, and MOC, and by forming a second ohmic layer 208 on the second p-type semiconductor layer 206 through a CVD process, a PVD process, and the like, a second light emitting part LE2 may be formed.

By turning over the second substrate, the second light emitting part LE2 may be temporarily attached onto a first support substrate. At this time, the second ohmic layer 208 may be brought into contact with the first support substrate. The second substrate may be removed through an LLO (laser lift-off) process or a CLO (chemical lift-off) process. Then, by turning over the first support substrate, the second light emitting part LE2 may be stacked on the first bonding part AD1, which is formed on the first light emitting part LE1. The first bonding part AD1 and the second n-type semiconductor layer 202 may be bonded with each other.

In some exemplary embodiments, the process of temporarily attaching the second light emitting part LE2 to the first support substrate may be is omitted. In this case, the second light emitting part LE2 may be directed attached onto the first bonding part AD1, such that the second ohmic layer 208 may be bonded to the first bonding part AD1.

A second color filter CF2 and a second bonding part AD2 may be formed on the second light emitting part LE2. In some exemplary embodiments, the second color filter CF2 may be selectively omitted.

By sequentially forming a third n-type semiconductor layer 302, a third active layer 304, and a third p-type semiconductor layer 306 on a third substrate by using a growing method, such as MOCVD, MBE, HVPE, and MOC, and by forming a third ohmic layer 308 on the third p-type semiconductor layer 306 through a CVD process, a PVD process, and the like, a third light emitting part LE3 may be formed.

By turning over the third substrate, the third light emitting part LE3 may be temporarily attached onto a second support substrate. At this time, the third ohmic layer 308 may be brought into contact with the second support substrate. The third substrate may be removed through an LLO process or a CLO process. Then, by turning over the second support substrate, the third light emitting part LE3 may be stacked on the second bonding part AD2, which is formed on the second light emitting part LE2. The second bonding part AD2 and the third n-type semiconductor layer 302 may be bonded with each other.

In some exemplary embodiments, the process of temporarily attaching the third light emitting part LE3 to the second support substrate may be omitted. In this case, the third light emitting part LE3 may be directly attached onto the second bonding part AD2, such that the third ohmic layer 308 may be bonded to the second bonding part AD2.

Figure 11A:
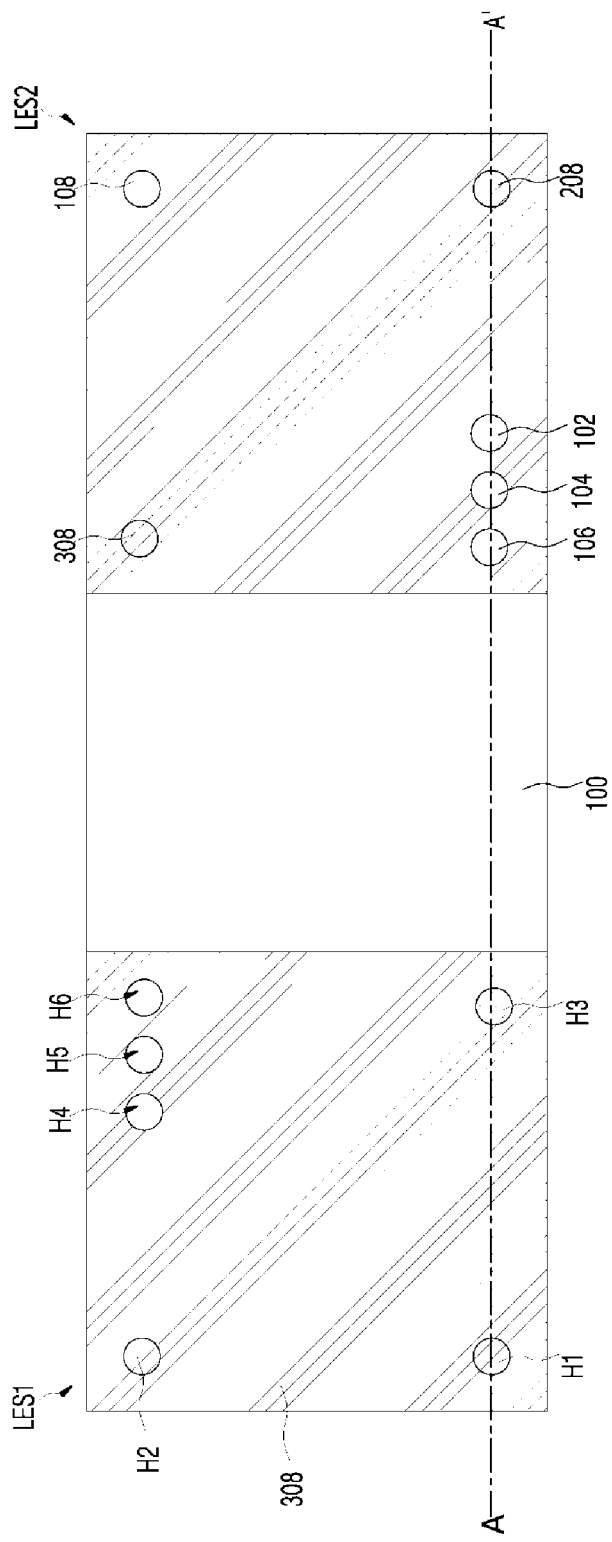
Figure 11B:
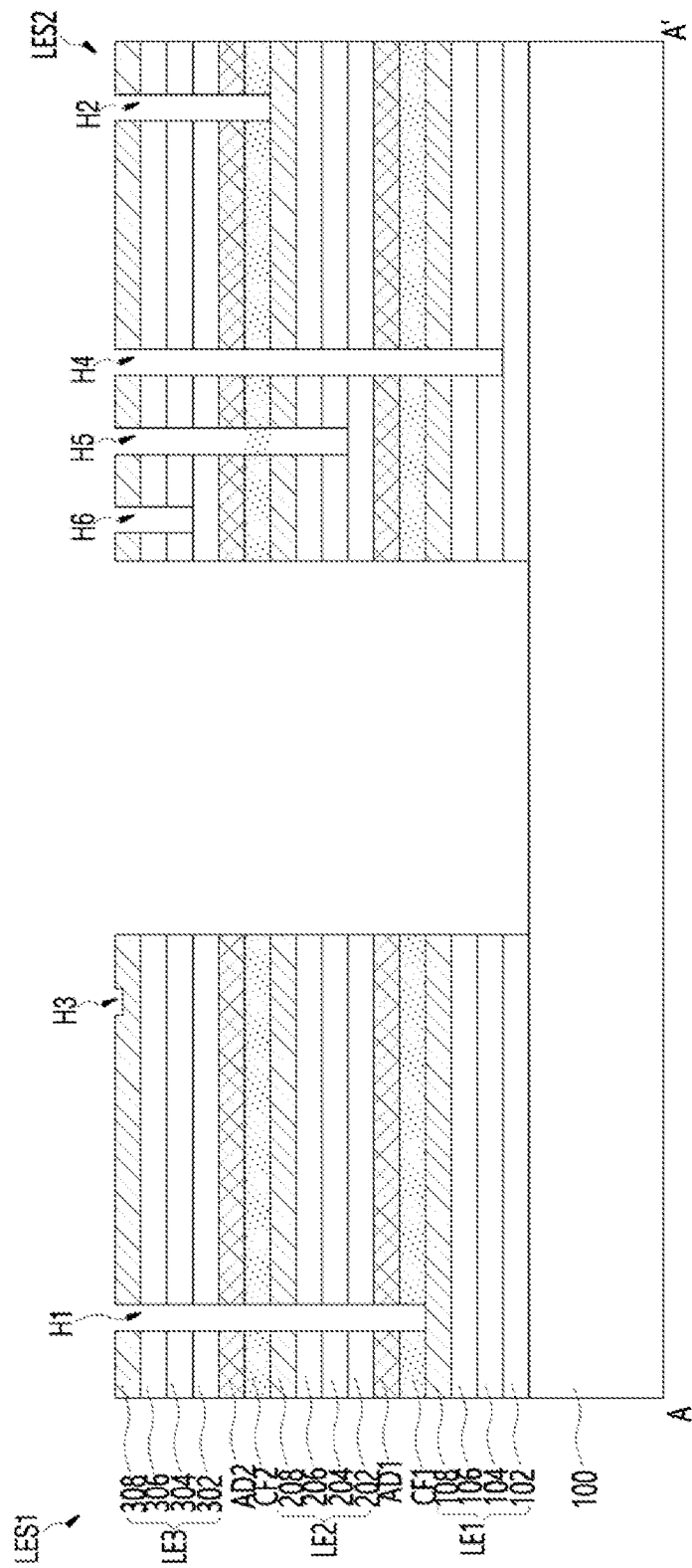

Referring to FIGS. 11A and 11B, by etching the first light emitting part LE1, the first color filter CF1, the first bonding part AD1, the second light emitting part LE2, the second color filter CF2, the second bonding part AD2, and the third light emitting part LE3, a first via hole H1, a second via hole H2, a third via hole H3, a fourth via hole H4, a fifth via hole H5, and a sixth via hole H6 may be formed.

The first via hole H1 may expose the first ohmic layer 108, the second via hole H2 may expose the second ohmic layer 208, and the third via hole H3 may expose the third ohmic layer 308. The fourth via hole H4 may expose the first n-type semiconductor layer 102, the fifth via hole H5 may expose the second n-type semiconductor layer 202, and the sixth via hole H6 may expose the third n-type semiconductor layer 302.

According to an exemplary embodiment, while forming the first via hole H1, the second via hole H2, the third via hole H3, the fourth via hole H4, the fifth via hole H5, and the sixth via hole H6, the first light emitting part LE1, the second light emitting part LE2, and the third light emitting part LE3 that are vertically stacked may be individualized to form a plurality of light emitting structures LES.

Figure 12A:
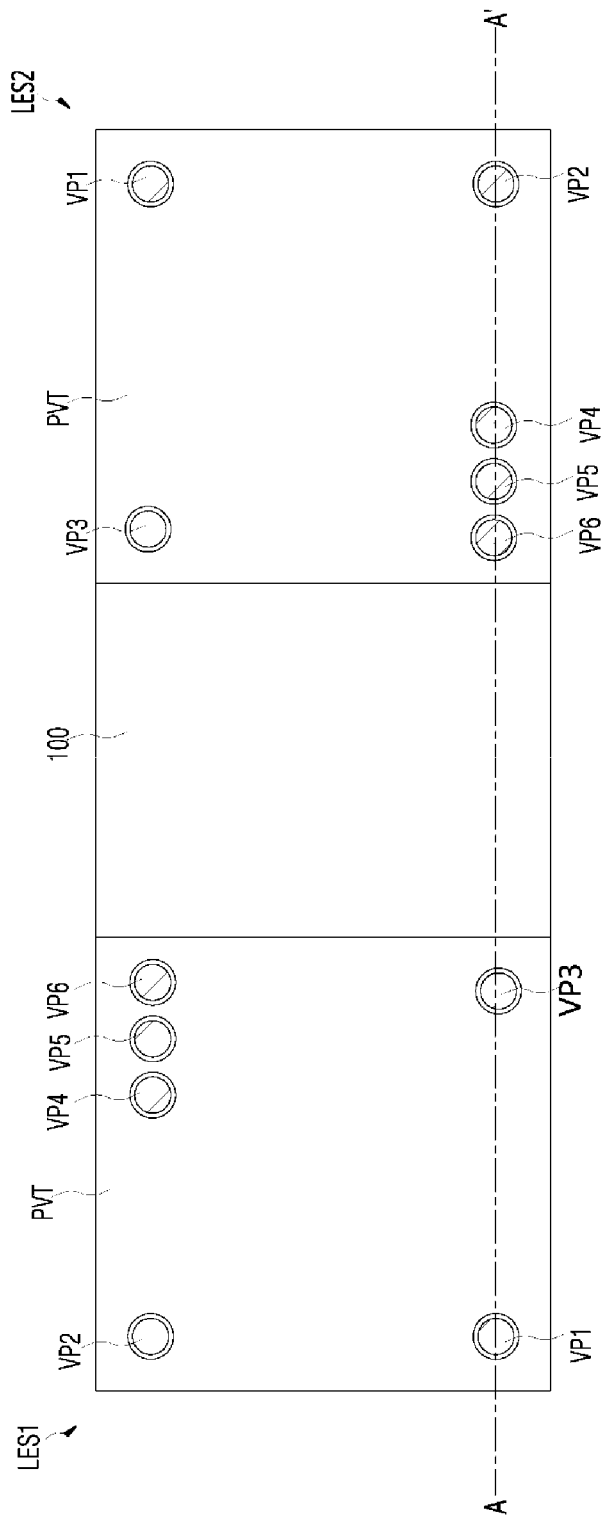
Figure 12B:
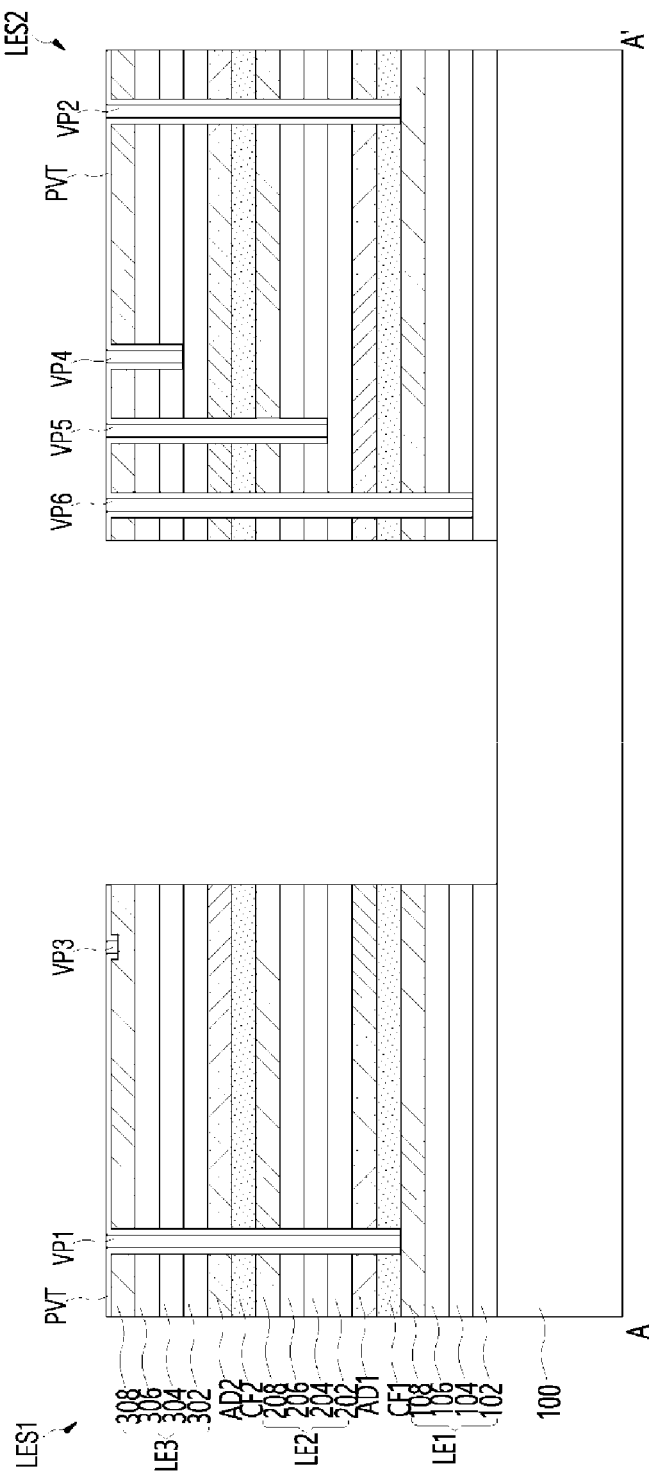

Referring to FIGS. 12A and 12B, a passivation layer PVT may be continuously formed on the third ohmic layer 308 of each of the light emitting structures LES, which is formed with the first via hole H1, the second via hole H2, the third via hole H3, the fourth via hole H4, the fifth via hole H5, and the sixth via hole H6, so as not to completely fill the first via hole H1, the second via hole H2, the third via hole H3, the fourth via hole H4, the fifth via hole H5, and the sixth via hole H6. Then, the passivation layer PVT formed at the respective bottoms of the first via hole H1, the second via hole H2, the third via hole H3, the fourth via hole H4, the fifth via hole H5, and the sixth via hole H6 may be selectively removed. In this manner, the passivation layer PVT may be retained on the top surface of the third ohmic layer 308 and the respective sidewalls of the first via hole H1, the second via hole H2, the third via hole H3, the fourth via hole H4, the fifth via hole H5, and the sixth via hole H6.

A first through pattern VP1, a second through pattern VP2, a third through pattern VP3, a fourth through pattern VP4, a fifth through pattern VP5, and a sixth through pattern VP6 may be formed in the first via hole H1, the second via hole H2, the third via hole H3, the fourth via hole H4, the fifth via hole H5, and the sixth via hole H6, respectively, which are formed with the passivation layer PVT.

Figure 13A:
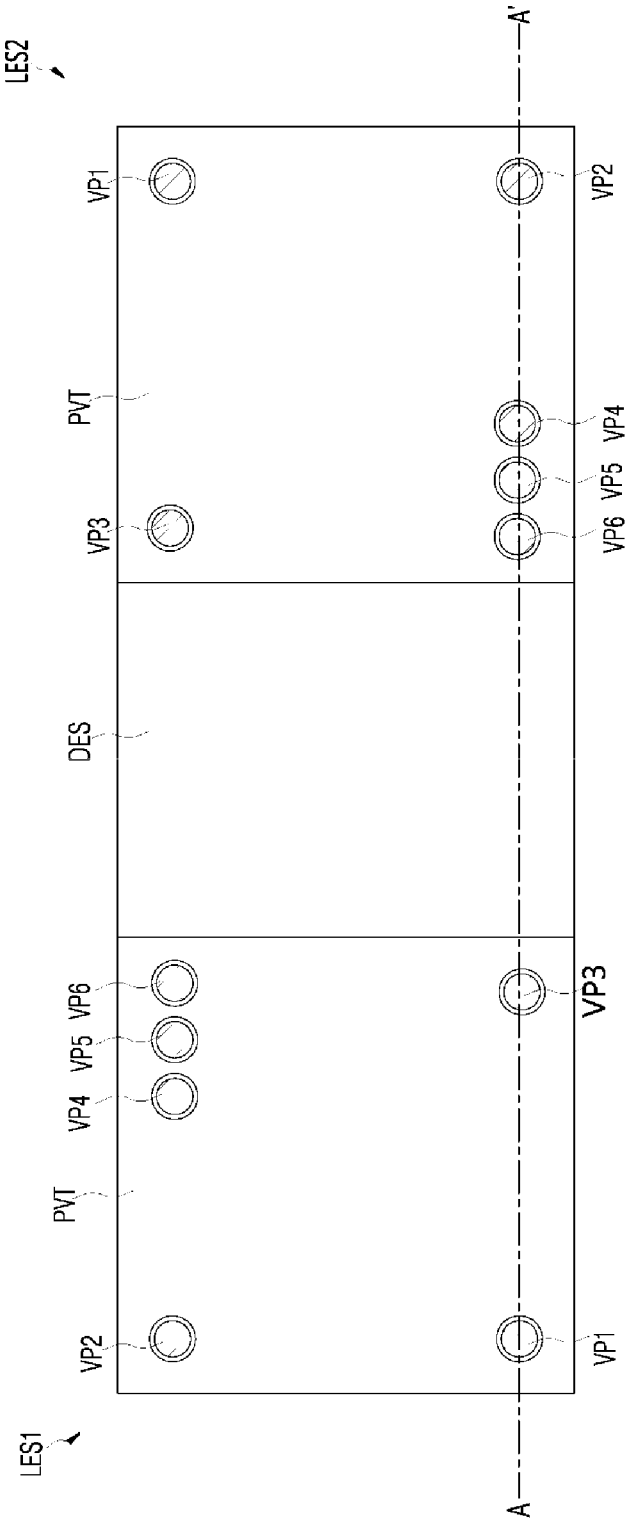
Figure 13B:
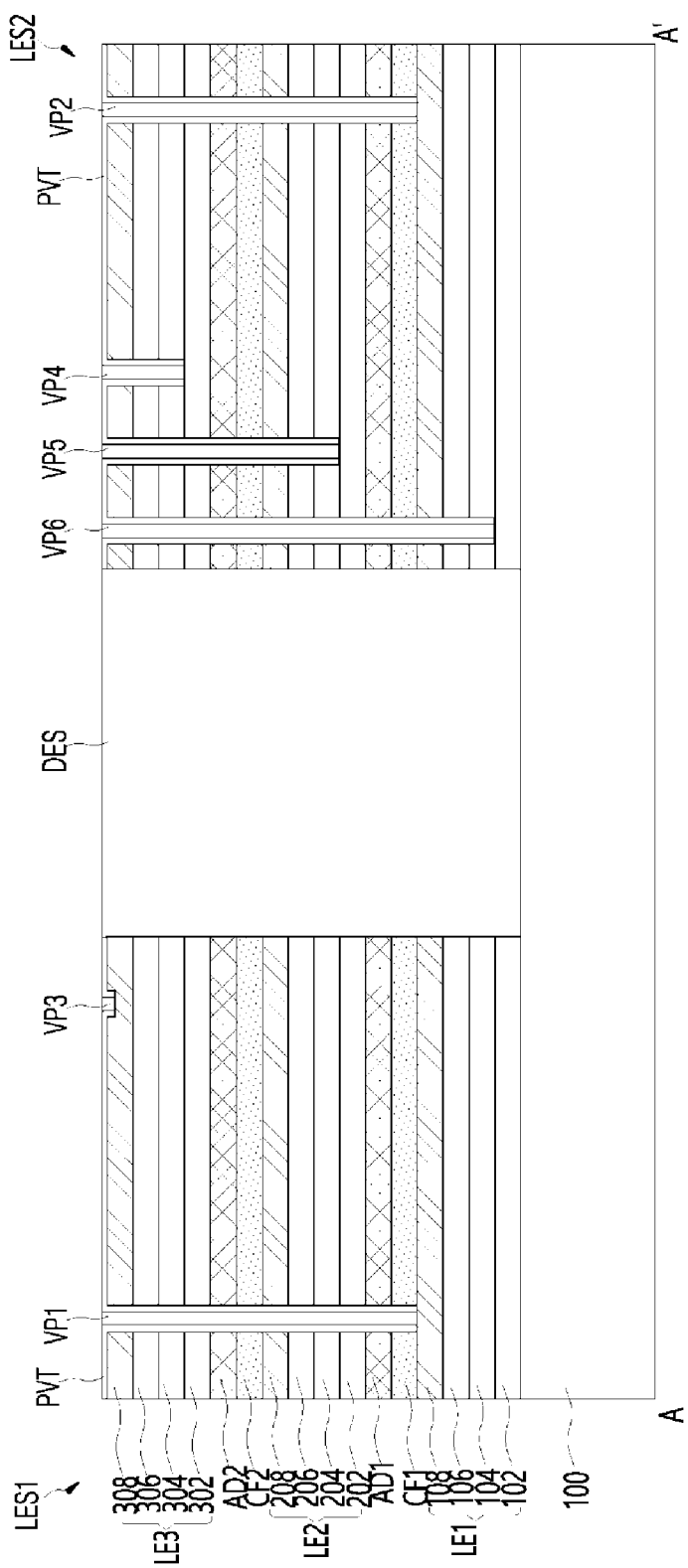

Referring to FIGS. 13A and 13B, a dielectric structure DES may be formed between the plurality of light emitting structures LES. For example, after forming the dielectric structure DES between the light emitting structures LES to cover the top surfaces of the light emitting structures LES, the top surface of the dielectric structure DES may be polished, such that the passivation layer PVT is exposed.

The dielectric structure DES may include a material that has an etching selectivity with respect to the passivation layer PVT and an etchant. In particular, while the dielectric structure DES is etched, the passivation layer PVT may not be substantially etched.

Figure 14A:
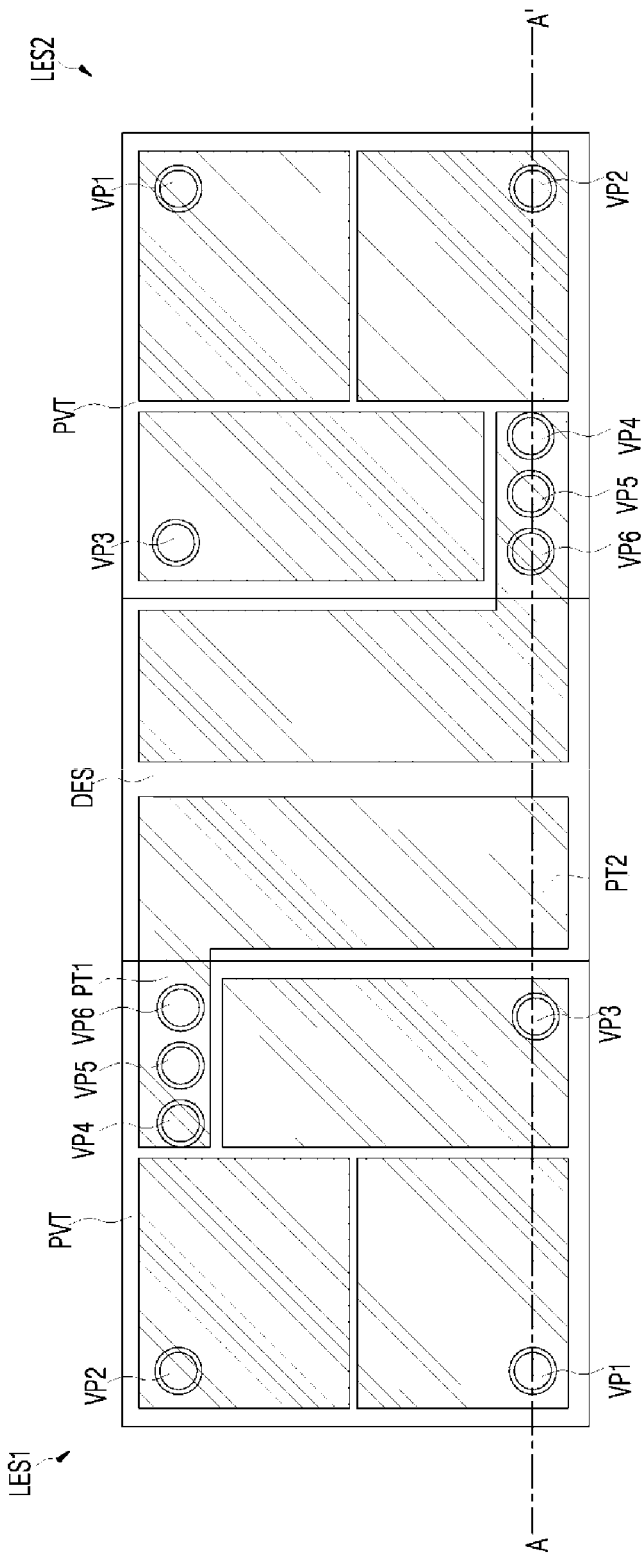
Figure 14B:
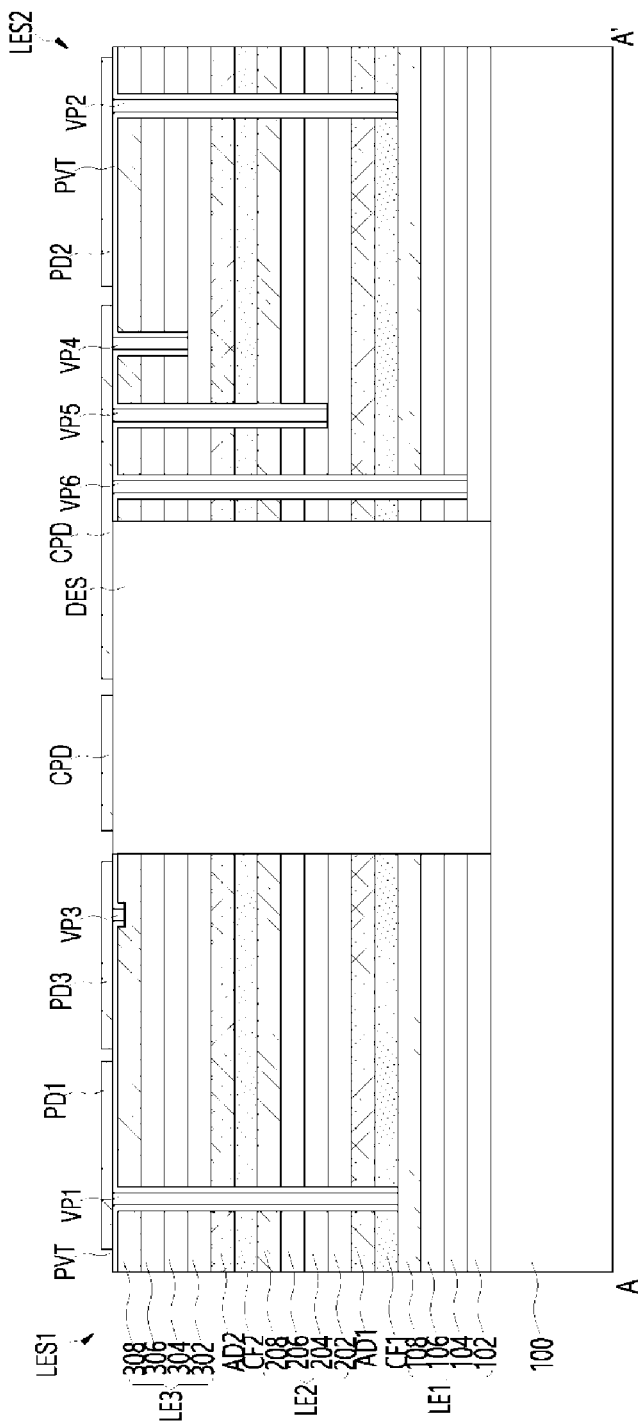
Figure 15:
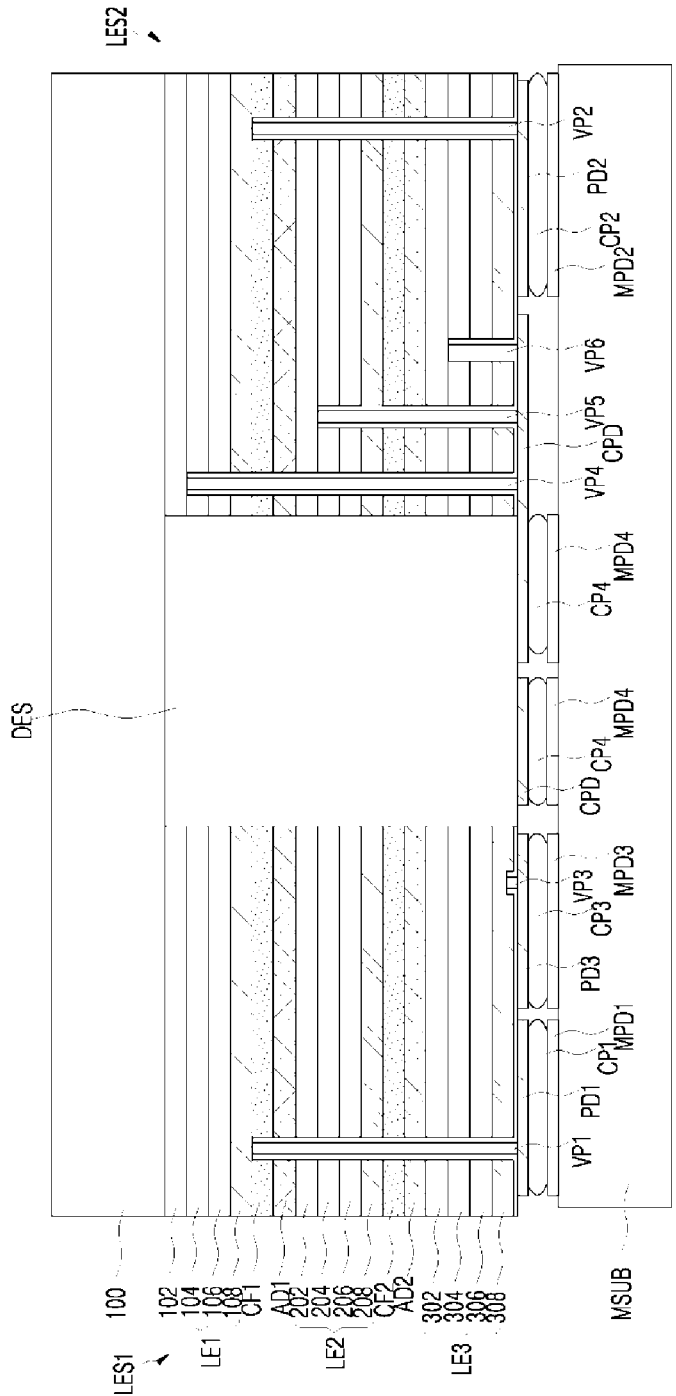
FIG. 15 is a cross-sectional view illustrating the light emitting device of FIG. 14B mounted to a mounting substrate.

Referring to FIGS. 14A and 14B, a first pad PD1 electrically coupled with the first through pattern VP1, a second pad PD2 electrically coupled with the second through pattern VP2, a third pad PD3 electrically coupled with the third through pattern VP3, and a common pad CPD electrically coupled in common with the fourth through pattern VP4, the fifth through pattern VP5, and the sixth through pattern VP6 may be formed.

According to an exemplary embodiment, a mask pattern may be formed on the first through pattern VP1, the second through pattern VP2, the third through pattern VP3, the fourth through pattern VP4, the fifth through pattern VP5, and the sixth through pattern VP6 and the passivation layer PVT. The mask pattern may include a first hole, a second hole, and a third hole, which respectively expose the first through pattern VP1, the second through pattern VP2, and the third through pattern VP3, and a fourth hole that exposes each of the fourth through pattern VP4, the fifth through pattern VP5, and the sixth through pattern VP6. A pad layer, which fills the first hole, the second hole, the third hole, and the fourth hole may be formed on the mask pattern. By etching the pad layer to expose the mask pattern, the first pad PD1, the second pad PD2, the third pad PD3, and the common pad CPD may be formed. After forming the first pad PD1, the second pad PD2, the third pad PD3, and the common pad CPD, the mask pattern may be removed.

When the size of a light emitting device is reduced to several tens of micrometers, the separation distance between the first pad PD1, the second pad PD2, the third pad PD3, and the common pad CPD may become very narrow. In this case, when a pad layer is formed and be etched by forming a mask pattern thereon, pad layer etching residues, such as metal particles, may be remained between the first pad PD1, the second pad PD2, the third pad PD3, and the common pad CPD, which may cause short-circuit between the pads.

According to an exemplary embodiment, since a mask pattern is formed, the first pad PD1, the second pad PD2, the third pad PD3, and the common pad CPD are formed and then the mask pattern is removed, it is possible to prevent the first pad PD1, the second pad PD2, the third pad PD3, and the common pad CPD from being short-circuited by etching residues, such as metal particles.

According to the illustrated exemplary embodiment, as each of the first pad PD1, the second pad PD2, and the third pad PD3 is disposed within the light emitting structure LES, the outer sidewall of each of the first pad PD1, the second pad PD2, and the third pad PD3 may be disposed within the outer sidewall of the light emitting structure LES. As a first portion PT1 of the common pad CPD is positioned within the light emitting structure LES and a second portion PT2 of the common pad CPD is positioned within the dielectric structure DES, the outer sidewall of the common pad CPD may be disposed within the outer sidewall of the light emitting structure LES and the outer sidewall of the dielectric structure DES.

Each of the first pad PD1, the second pad PD2, the third pad PD3, and the common pad CPD may have various structures according to exemplary embodiments. Depending on the structures of the first pad PD1, the second pad PD2, the third pad PD3, and the common pad CPD, the structures of the first through pattern VP1, the second through pattern VP2, the third through pattern VP3, the fourth through pattern VP4, the fifth through pattern VP5, and the sixth through pattern VP6 may be variously modified.

Referring to FIG. 15, a light emitting device including a first light emitting structure LES1 and a second light emitting structure LES2 may be mounted onto a mounting substrate MSUB, which is formed with a plurality of pads MPD1, MPD2, MPD3, and MP4.

For example, a first conductive part CP1, a second conductive part CP2, a third conductive part CP3, and a fourth conductive part CP4 may be respectively formed on the first pad PD1, the second pad PD2, the third pad PD3, and the common pad CPD of the light emitting device as shown in FIG. 1C. As another example, a first conductive part CP1, a second conductive part CP2, a third conductive part CP3, and a fourth conductive part CP4 may be respectively formed on the first pad MPD1, the second pad MPD2, the third pad MPD3, and the fourth pad MPD4 of the mounting substrate MSUB. As still another example, first conductive parts CP1, second conductive parts CP2, third conductive parts CP3, and fourth conductive parts CP4 may be respectively formed on the first pad PD1, the second pad PD2, the third pad PD3, and the common pad CPD of the light emitting device and on the first pad MPD1, the second pad MPD2, the third pad MPD3, and the fourth pad MPD4 of the mounting substrate MSUB.

By turning over the first substrate 100, the first pad PD1, the second pad PD2, the third pad PD3, and the common pad CPD of the light emitting device may be disposed to face the first pad MPD1, the second pad MPD2, the third pad MPD3, and the fourth pad MPD4 of the mounting substrate MSUB.

Successively, by performing thermal treatment or the like to the first conductive part CP1, the second conductive part CP2, the third conductive part CP3, and the fourth conductive part CP4, the first light emitting structure LES1 and the second light emitting structure LES2 may be mounted onto the mounting substrate.

In some exemplary embodiments, the first substrate 100 may be removed.

According to the light emitting device according to exemplary embodiments, at least one of the pads of a light emitting structure may be extended to a dielectric structure, and the other pads spaced apart from one another may have increased sizes. In this manner, even when the light emitting device has a reduced size of a micro unit, sufficient areas for the pads may be secured.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting apparatus comprising:
   a light emitting structure including a plurality of light emitting parts comprising a first light emitting part, a second light emitting part, and a third light emitting part each including a first-type semiconductor layer, an active layer, and a second-type semiconductor layer;
   a dielectric structure disposed outside the light emitting; and
   a plurality of pads disposed on a first surface of the light emitting structure and electrically coupled with the light emitting parts, the pads comprising:
      a first pad electrically coupled with the second-type semiconductor layer of the first light emitting part;
      a second pad electrically coupled with the second-type semiconductor layer of the second light emitting part;
      a third pad electrically coupled with the second-type semiconductor layer of the third light emitting part; and
      a common pad electrically coupled with the first-type semiconductor layers of the first, second, and third light emitting parts, the common pad comprising:
         a first portion covering at least a portion of the first light emitting part and having a first width in a first direction; and
         a second portion extending from the first portion to the first surface of the dielectric structure and having a second width greater than the first width in the first direction,
   wherein outer sidewalls of the pads are disposed in a region defined by the light emitting structure and the dielectric structure,
   wherein one of the pads extends from the first surface of the light emitting structure to be disposed on a first surface of the dielectric structure, and
   wherein the common pad vertically overlaps at least a portion of each of the first light emitting part, the second light emitting part, and the third light emitting part.

2. The light emitting apparatus according to claim 1, wherein remaining pads except the one of the pads that extends to the dielectric structure are disposed within the light emitting structure.

3. The light emitting apparatus according to claim 1, wherein the one of the pads that extend to the dielectric structure comprises the common pad.

4. The light emitting apparatus according to claim 3, wherein remaining pads except the one of the pads that extends to the dielectric structure have a third width greater than the first width.

5. The light emitting apparatus according to claim 1, wherein the one of the pads that extends to the dielectric structure comprises:
   a first portion disposed on the first surface of the light emitting structure and having a first area; and
   a second portion extending from the first portion to the first surface of the dielectric structure and having a second area greater than the first area.

6. The light emitting apparatus according to claim 1, wherein the pads are horizontally spaced apart from each another.

7. The light emitting apparatus according to claim 1, wherein:
   the light emitting structure is formed in plural;
   the dielectric structure is disposed between the light emitting structures; and
   the one of the pads that extends to the first surface of the dielectric structure is electrically coupled with at least one of light emitting parts of a neighboring light emitting structure.

8. The light emitting apparatus-according to claim 1, further comprising conductive parts disposed on the pads and electrically bonding the pads to a mounting substrate,
   wherein the one of the pads is disposed between at least one of the conductive parts and the first surface of the dielectric structure.

9. The light emitting apparatus according to claim 1, wherein:
   the first pad is electrically coupled with the second-type semiconductor layer of the first light emitting part through a first through pattern;
   the second pad is electrically coupled with the second-type semiconductor layer of the second light emitting part through a second through pattern;
   the third pad is electrically coupled with the second-type semiconductor layer of the third light emitting part through a third through pattern; and
   the common pad is electrically coupled with the first-type semiconductor layers of the first, second, and third light emitting parts through a fourth through pattern, a fifth through pattern, and a sixth through pattern.

10. The light emitting apparatus according to claim 9, wherein each of the first and third pads has a third width greater than the first width.

11. The light emitting apparatus according to claim 9, wherein:

the common pad entirely covers the first surface of the light emitting structure and includes holes exposing the first, second, and third through patterns, respectively; and the first, second, and third through patterns are electrically coupled with the first, second, and third pads through the holes, respectively.

12. The light emitting apparatus according to claim 11, further comprising a passivation layer insulating the common pad and the first, second, and third pads from one another.

13. The light emitting apparatus according to claim 9, wherein:

the light emitting structure is formed in plural;

the dielectric structure is disposed between the light emitting structures; and the common pads of neighboring light emitting structures are integrated with each other.

14. The light emitting apparatus according to claim 13, wherein the first-type semiconductor layers of neighboring light emitting structures are integrated with each other.

\* \* \* \* \*